United States Patent
Hirano et al.

(10) Patent No.: US 7,157,789 B2
(45) Date of Patent: Jan. 2, 2007

(54) SEMICONDUCTOR DEVICE AND METHOD FOR MANUFACTURING THE SAME

(75) Inventors: Koichi Hirano, Hirakata (JP);
Yoshiyuki Yamamoto, Ibaraki (JP);
Seiichi Nakatani, Hirakata (JP);
Toshiyuki Kojima, Uji (JP); Shingo Komatsu, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 11/136,110

(22) Filed: May 24, 2005

(65) Prior Publication Data
US 2005/0263860 A1    Dec. 1, 2005

(30) Foreign Application Priority Data
May 26, 2004    (JP)    ............... 2004-156631

(51) Int. Cl.
*H01L 23/552*    (2006.01)
(52) U.S. Cl. ............. 257/659; 257/692; 257/750; 257/776; 257/E23.07
(58) Field of Classification Search ........... 257/659
See application file for complete search history.

(56) References Cited

U.S. PATENT DOCUMENTS 5,668,405 A    9/1997    Yamashita ............... 257/668
6,924,987 B1 *    8/2005    Sugimoto et al. ........... 361/794

FOREIGN PATENT DOCUMENTS

| JP | 4-286134 | 10/1992 |
|---|---|---|
| JP | 2595909 | 1/1997 |
| JP | 2000-36504 | 2/2000 |

* cited by examiner

*Primary Examiner*—Tu-Tu Ho
(74) *Attorney, Agent, or Firm*—Hamre, Schumann, Mueller & Larson, P.C.

(57) ABSTRACT

An example of a semiconductor device of the present invention includes a first semiconductor element including a first element body portion and a first element electrode that is provided on a first face of the first element body portion; a wiring board including an insulating substrate and a first wiring layer that is formed on one principal face of the insulating substrate, the wiring board being disposed such that the one principal face of the wiring board is opposed to a second face of the first element body portion; a first film that covers at least a portion of a face of the first semiconductor element that includes the surface of the first element electrode and at least a portion of a face on the first semiconductor element side of the wiring board; and a second wiring layer that is formed on a face on the wiring board side of the first film and that includes a first conductor having first and second ends. The first end of the first conductor is bonded to the first element electrode, and the second end of the first conductor is bonded to a portion of the first wiring layer.

30 Claims, 12 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same. In particular, the present invention relates to a semiconductor device including a wiring board and a semiconductor element that is mounted on the wiring board, and to a method for manufacturing the same.

2. Related Background Art

Techniques for connecting a semiconductor element to conductors of a wiring board can be divided broadly into (1) wire bonding (WB) method (see JP H4-286134A, for example), (2) flip chip bonding (FC) method (see JP 2000-36504A, for example), (3) TAB (tape automated bonding) method (see JP H8-88245A, for example), and the like. Hereinafter, these methods will be described briefly.

First, the WB method will be described with reference to FIGS. 17A, 17B, and 18. FIG. 17A is a plan view for explaining a state in which a semiconductor chip and a lead frame are connected to each other by bonding wires, and FIG. 17B is a cross-sectional view taken along the line A—A in FIG. 17A. FIG. 18 is a cross-sectional view of a semiconductor device for which the WB method is employed.

As shown in FIGS. 17A and 17B, in the WB method, the semiconductor chip 501 is first die-bonded to a die pad 504 of the lead frame. Then, wire bonding pads 502 of the semiconductor chip 501 are connected to inner lead portions of external terminals 505 of the lead frame via the bonding wires 503. Subsequently, as shown in FIG. 18, a region including the semiconductor chip 501 and the inner lead portions of the external terminals 505 is sealed with a sealing resin 506, and thus a resin-sealed product (semiconductor device) 500 is obtained.

Next, the FC method will be described with reference to FIG. 19. FIG. 19 shows a cross-sectional configuration of a semiconductor device 600 for which the FC method is employed. In the FC method, wiring layers 602 of a substrate 601 (wiring board) are connected to electrodes 604 of a semiconductor chip 605 via bumps 603. A gap between the substrate 601 and the semiconductor chip 605 is sealed with a sealing resin 607, and the wiring layers 602, the bumps 603, and the electrodes 604 are embedded in the sealing resin 607. In FIG. 19, numeral 606 indicates a sensitive area in which a transistor, for example, is formed.

Next, a semiconductor device for which the TAB method is employed will be described with reference to FIGS. 20 to 23. FIGS. 20 and 22 show a cross-sectional configuration of the semiconductor device 700 for which the TAB method is employed, and FIGS. 21 and 23 show a state in which the semiconductor device 700 is mounted on a mount board 709.

The semiconductor device 700 shown in FIGS. 20 and 22 includes a base film 702 and a semiconductor IC chip 701. The semiconductor IC chip 701 is disposed in a device hole that is formed in the base film 702. Copper foil conductors 703 are formed on one face of the base film 702. Electrodes 701a of the semiconductor IC chip 701 are connected to inner tip portions (inner leads 703a) of the copper foil conductors 703. At portions of the copper foil conductor 703 that are located on the outer side relative to the inner lead 703a, there are provided lands 703b for external connection. Solder bumps 706 are connected to the lands 703b. Through holes 702a are formed in the base film 702, and a pore 703c is formed at the center of each land 703b. A cover resist 704 is formed on the base film 702. The device hole is filled up with a sealing resin 705 for protecting the semiconductor IC chip 701.

In this semiconductor device 700, the solder bumps 706 serve as outer leads. As shown in FIGS. 21 and 23, the solder bumps 706 are placed on pads 709a on the mount board 709, and the semiconductor device 700 is mounted on the mount board 709 using a mass reflow process.

However, in the semiconductor device 500 for which the WB method is employed, the wire bonding pads 502 and the external terminals 505 are connected to each other one by one by the bonding wires 503. Thus, there is a problem in that as the number of wire bonding pads 502 or external terminals 505 increases, the time and effort required for the operation increase and productivity decreases (see FIGS. 17A and 17B). As shown in FIG. 18, the semiconductor device 500 for which the WB method is employed has a structure in which a portion of each bonding wire 503 is positioned below the lower surface of the semiconductor chip 501, in this drawing, and the semiconductor chip 501 and the bonding wires 503 are sealed with the sealing resin 506. Therefore, there is a significant limitation in reducing the thickness of the semiconductor device 500. Moreover, the spacing between the adjacent wire bonding pads 502 is defined by the spacing between the adjacent external terminals 505. The external terminals 505 are soldered to the substrate. Thus, in the present circumstances, the spacing between the external terminals is about 0.4 mm so that problems such as short-circuiting between the external terminals can be prevented. Even if the spacing between the wire bonding pads 502 of the semiconductor chip can be reduced, it is difficult to reduce the spacing between the external terminals 505 to less than 0.4 mm. This fact has been a hindrance to reducing the size of the semiconductor device.

The semiconductor device 600 (see FIG. 19) for which the FC method is employed has the following problems. In the semiconductor device for which the FC method is employed, the spacing between the adjacent electrodes 604 is smaller than the spacing between the external terminals 505 (see FIG. 17). Therefore, alignment of the semiconductor chip 605 and the substrate 601 needs to be performed with very high accuracy.

Moreover, there also is a problem in that the substrate 601 tends to be expensive. The reason for this is that in the semiconductor device for which the FC method is employed, the substrate 601 is required to have the wiring layer 602 that includes fine conductors corresponding to the electrodes 604 of the semiconductor chip 605. Another reason is that when there is a large number of electrodes 604, the substrate 601 (wiring board) is required to have a multilayer structure, which leads to an increase in the cost.

Moreover, the semiconductor device 600 for which the FC method is employed has a structure in which the semiconductor chip 605 is connected to the wiring board 601 via the bumps 603, so that it is necessary to match the coefficient of linear thermal expansion of the semiconductor chip 605 with the coefficient of linear thermal expansion of the substrate 601 as closely as possible. The reason for this is that when there is a great difference between the coefficient of linear thermal expansion of the semiconductor chip 605 and the coefficient of linear thermal expansion of the substrate 601, a stress is applied to, for example, the bumps 603, and thus the electric connection between the semiconductor chip 605 and the wiring board 601 may be damaged. Therefore, it is necessary to match the coefficients of linear thermal expansion of these two components, and thus there is a severe limitation on the material selection.

Furthermore, in the semiconductor device 600 for which the FC method is employed, after connecting the semiconductor chip 605 to the substrate 601 via the bumps 603, the gap between the semiconductor chip 605 and the substrate 601 is filled up with a resin (underfill agent) 607, and this step increases the cost and also the number of steps, so that productivity decreases. Moreover, there also is a problem in that the heat dissipation of the semiconductor chip in the semiconductor device 600 for which the FC method is employed is lower than that in the semiconductor device for which the WB method is employed. In the semiconductor device for which the WB method is employed, one face of the body portion of the semiconductor chip is secured to the die pad having high heat conductivity via a thin bonding-material layer that is constituted by resin, solder, and the like, so that the heat dissipation of the semiconductor chip is relatively high. On the other hand, in the semiconductor device for which the FC method is employed, the semiconductor chip 605 is connected to the substrate 601 via the bumps 603, so that the distance between a face of the body portion of the semiconductor chip 605 that is in opposition to the substrate 601 and a face on the semiconductor element 605 side of the substrate 601 is larger than in the semiconductor device for which the WB method is employed, and thus, the heat dissipation of the semiconductor chip is low. Moreover, in the manufacturing process of the semiconductor device 600 for which the FC method is employed, it is necessary to form the bumps 603, which takes time and effort.

The semiconductor device 700 for which the TAB method is employed has the following problems. In the manufacturing process of the semiconductor device 700 for which the TAB method is employed, an inner lead bonding (ILB) step in which the electrodes 701*a* of the semiconductor IC chip 701 are connected to the inner leads 703*a* and an outer lead bonding (OLB) step in which the solder bumps 706 are formed at the lands 703*b* are performed using completely different methods, and thus these steps take time and effort. Moreover, it is necessary to seal the semiconductor IC chip 701 that is disposed in the device hole with the sealing resin 705. This step also takes time and effort, so that the productivity of the semiconductor device 700 for which the TAB method is employed is low.

The present invention provides a semiconductor device for which the disadvantages of the semiconductor devices for which the WB method, the FC method, or the TAB method is employed has been reduced. The present invention provides a semiconductor device having high productivity, for example.

SUMMARY OF THE INVENTION

The semiconductor device of the present invention includes a first semiconductor element including a first element body portion having a first face and a second face opposite to the first face, and a first element electrode that is formed on the first face; a wiring board including an insulating substrate and a first wiring layer that is formed on one principal face of the insulating substrate, the wiring board being disposed such that said one principal face is opposed to the second face of the first element body portion; a first film that covers at least a portion of a face of the first semiconductor element that includes the surface of the first element electrode and at least a portion of a face on the first semiconductor element side of the wiring board; and a second wiring layer that is formed on a face on the wiring board side of the first film and that includes a first conductor having first and second ends, wherein the first end of the first conductor is bonded to the first element electrode and the second end of the first conductor is bonded to a portion of the first wiring layer.

The method for manufacturing a semiconductor device of the present invention includes a mounting step in which: a first semiconductor element having a first element body portion and a first element electrode that is provided on the first element body portion is laid on a wiring board including an insulating substrate and a first wiring layer that is formed on one principal face of the insulating substrate such that a face of the first element body portion that is opposite to a face of the first element body portion on which the first element electrode is provided is opposed to said one principal face of the insulating substrate; in a sheet including a film and a second wiring layer that is formed on one principal face of the film and that includes a first conductor having first and second ends, the first end of the first conductor is bonded to the first element electrode and the second end of the first conductor is bonded to a portion of the first wiring layer; and at least a portion of a face that includes the surface of the first element electrode and at least a portion of a face on the first semiconductor element side of the wiring board are covered with the film.

DETAILED DESCRIPTION OF THE INVENTION

Figure 1A:
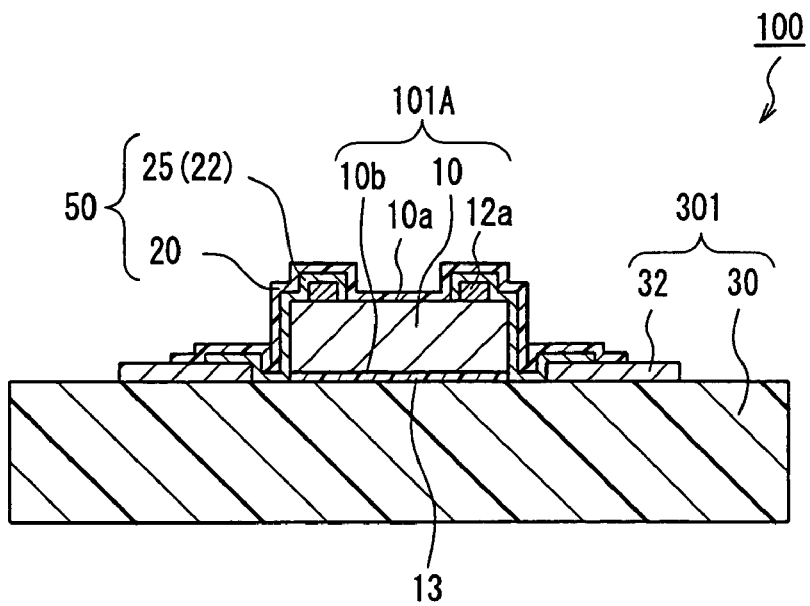
FIG. 1A is a cross-sectional view schematically showing an example of a semiconductor device of Embodiment 1 of the present invention.

In an example of the semiconductor device of the present invention, it is preferable that the first film is substantially transparent. Here, being "substantially transparent" means being transparent to such a level that the first element electrode of the first semiconductor element that is located on one principal face side of the first film and/or the first wiring layer that is formed on the insulating substrate can be seen from the other principal face side of the first film.

In an example of the semiconductor device of the present invention, it is preferable that the first semiconductor element and the insulating substrate are bonded to each other via a bonding material.

In an example of the semiconductor device of the present invention, it is preferable that the semiconductor device further includes an electromagnetic shielding layer that is formed on a face of the first film that is opposite to the face on the wiring board side face of the first film.

In an example of the semiconductor device of the present invention, it is preferable that a portion of a face on the second wiring layer side of a laminated product constituted by the first film and the second wiring layer is adhered directly or indirectly to the face of the first semiconductor element that includes the surface of the first element electrode. Moreover, in an example of the semiconductor device of the present invention, it is further preferable that another portion of the face on the second wiring layer side of the laminated product that is different from said portion also is adhered directly or indirectly to a lateral face of the first element body portion.

In an example of the semiconductor device of the present invention, it is preferable that a face on the wiring board side of a laminated product constituted by the first film and the second wiring layer is bonded directly or indirectly to the first semiconductor element and the wiring board, and the first semiconductor element is disposed within a closed space that is surrounded by the laminated product and the wiring board.

In an example of the semiconductor device of the present invention, it is preferable that the first end of the first conductor is in contact with the first element electrode, and the second end of the first conductor is in contact with the portion of the first wiring layer.

In an example of the semiconductor device of the present invention, it is preferable that the semiconductor device further includes a third wiring layer that is formed on a face of the first film that is opposite to the face on the wiring board side of the first film.

In an example of the semiconductor device of the present invention, it is preferable that the semiconductor device further includes a second semiconductor element having a second element electrode, wherein the second element electrode is bonded to the third wiring layer.

In an example of the semiconductor device of the present invention, it is preferable that a face of the first film that is opposite to the face on the wiring board side of the first film includes a flat surface having an area that is equal to or larger than the area of the first face of the first element body portion. Moreover, in an example of the semiconductor device of the present invention, the semiconductor device further includes a second semiconductor element having a second element body portion and a second element electrode that is provided on the second element body portion, wherein the second semiconductor element is disposed on the first film such that a face of the second element body portion that is opposite to a face of the second element body portion that includes the surface of the second element electrode is opposed to the flat surface of the first film.

In an example of the semiconductor device of the present invention, it is preferable that the semiconductor device further includes: a second film that covers at least a portion of the face of the second semiconductor element that includes the surface of the second element electrode and at least a portion of a face on the second semiconductor element side of the wiring board; and a fourth wiring layer that is formed on a face on the wiring board side of the second film and that includes a second conductor having first and second ends, wherein the first end of the second conductor is bonded to the second element electrode, and wherein the second end of the second conductor is bonded to another portion of the first wiring layer that is different from said portion of the first wiring layer to which the second end of the first conductor is bonded.

In an example of the semiconductor device of the present invention, it is preferable that a recessed portion is formed on the side of a face of the insulating substrate on which the first wiring layer is formed, and the first semiconductor element is disposed in the recessed portion.

In an example of the semiconductor device of the present invention, it is preferable that the face of the insulating substrate on which the first wiring layer is formed is substantially on the same plane with the first face of the first element body portion.

In an example of the semiconductor device of the present invention, it is preferable that a face of the first film that is opposite to the face on the wiring board side of the first film is substantially flat.

In an example of the semiconductor device of the present invention, it is preferable that the semiconductor device further includes a second semiconductor element having a second element body portion and a second element electrode that is provided on the second element body portion, wherein the second semiconductor element is disposed on the first film such that a face of the second semiconductor element that is opposite to a face of the second semiconductor element that includes the surface of the second element electrode is opposed to the flat surface of the first film.

In an example of the semiconductor device of the present invention, it is preferable that the semiconductor device further includes: a second film that covers at least a portion of the face of the second semiconductor element that includes the surface of the second element electrode and at least a portion of a face on the second semiconductor element side of the wiring board; and a fourth wiring layer that is formed on a face on the wiring board side of the second film and that includes a second conductor having first and second ends, wherein the first end of the second conductor is bonded to the second element electrode, and wherein the second end of the second conductor is bonded to another portion of the first wiring layer that is different from said portion of the first wiring layer to which the second end of the first conductor is bonded.

In an example of the semiconductor device of the present invention, it is preferable that the wiring board is a printed board or a glass board.

In an example of the method for manufacturing a semiconductor device of the present invention, it is preferable that in the mounting step, the first semiconductor element and the wiring board are bonded to each other.

In an example of the method for manufacturing a semiconductor device of the present invention, it is preferable that in the mounting step, bonding of the first end of the first conductor to the first element electrode and bonding of the second end of the first conductor to the portion of the first wiring layer are performed after the first semiconductor element and the wiring board are bonded to each other.

In an example of the method for manufacturing a semiconductor device of the present invention, it is preferable that in the mounting step, the first semiconductor element and the wiring board are bonded to each other after the first end of the first conductor is bonded to the first element electrode.

In an example of the method for manufacturing a semiconductor device of the present invention, it is preferable that in the mounting step, an ultrasonic vibration is used to bond the first end of the first conductor to the first element electrode and to bond the second end of the first conductor to the portion of the first wiring layer.

In an example of the method for manufacturing a semiconductor device of the present invention, it is preferable that in the mounting step, a portion of a face on the second wiring layer side of the sheet is adhered directly or indirectly to the face of the first semiconductor element that includes the surface of the first element electrode. For example, the film may contain a resin, and in the mounting step, the sheet is adhered to the face of the first semiconductor element that includes the surface of the first element electrode by causing the film to thermally contract by heating.

In an example of the method for manufacturing a semiconductor device of the present invention, it is preferable that in the mounting step, a face of the film that is opposite to a face on the second wiring layer side of the film is made flat by heating and pressing the film.

In an example of the method for manufacturing a semiconductor device of the present invention, it is preferable that the film contains a thermosetting resin that has not been cured, and in the mounting step, after the sheet is processed into a predetermined shape, the sheet is processed into a shape with which the sheet can cover at least a portion of the face of the first semiconductor element that includes the surface of the first element electrode and at least a portion of the face on the first semiconductor element side of the wiring board by curing the thermosetting resin by heating, and then, the first end of the first conductor is bonded to the first element electrode and the second end of the first conductor is bonded to the portion of the first wiring layer.

In an example of the method for manufacturing a semiconductor device of the present invention, it is preferable that a recessed portion is formed on the side of a face of the insulating substrate on which the first wiring layer is formed, and in the mounting step, the first semiconductor element is disposed in the recessed portion.

In an example of the method for manufacturing a semiconductor device of the present invention, it is preferable that the method further includes, after the mounting step, a step of disposing a second semiconductor element having a second element electrode, on a face of the film that is opposite to a face of the film on which the second wiring layer is formed, wherein in this step, the second semiconductor element is disposed on the film such that a face of the second semiconductor element that is opposite to a face of the second semiconductor element that includes the surface of the second element electrode is opposed to the flat surface of the film.

Hereinafter, examples of the semiconductor device of the present invention and the method for manufacturing the same will be described with reference to the drawings. In the drawings, components having substantially the same function are provided with the same numerals for brevity of the description. The present invention is not limited to the embodiments described below.

Embodiment 1

Figure 1B:
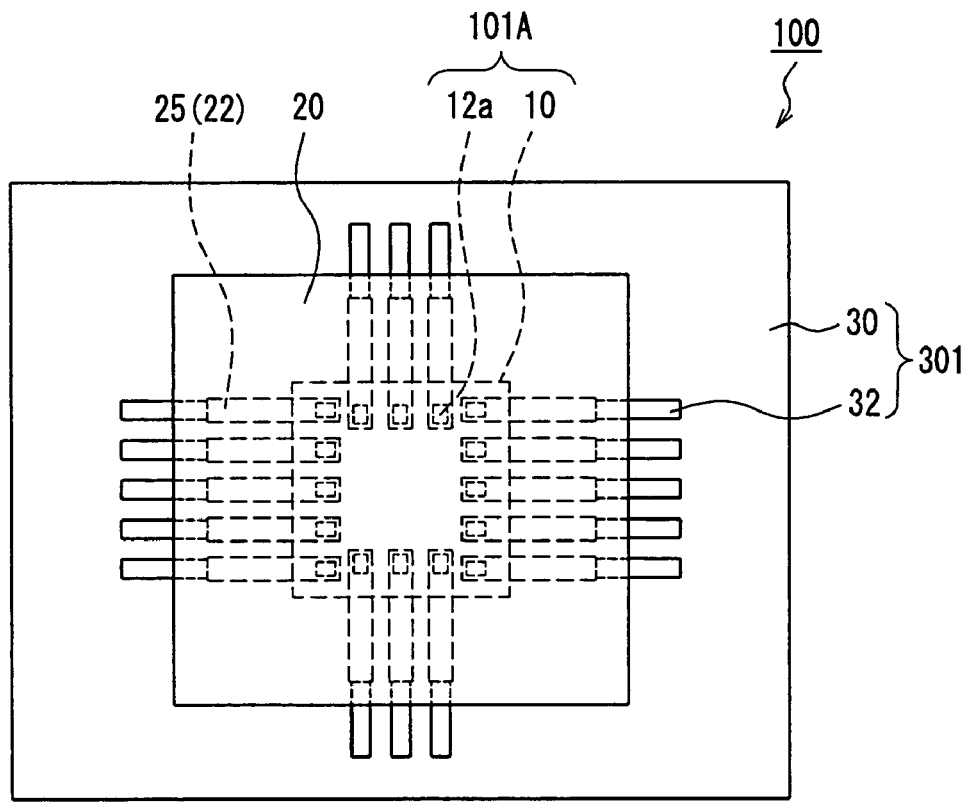
FIG. 1B is a top view schematically showing the semiconductor device in FIG. 1A.
Figure 2:
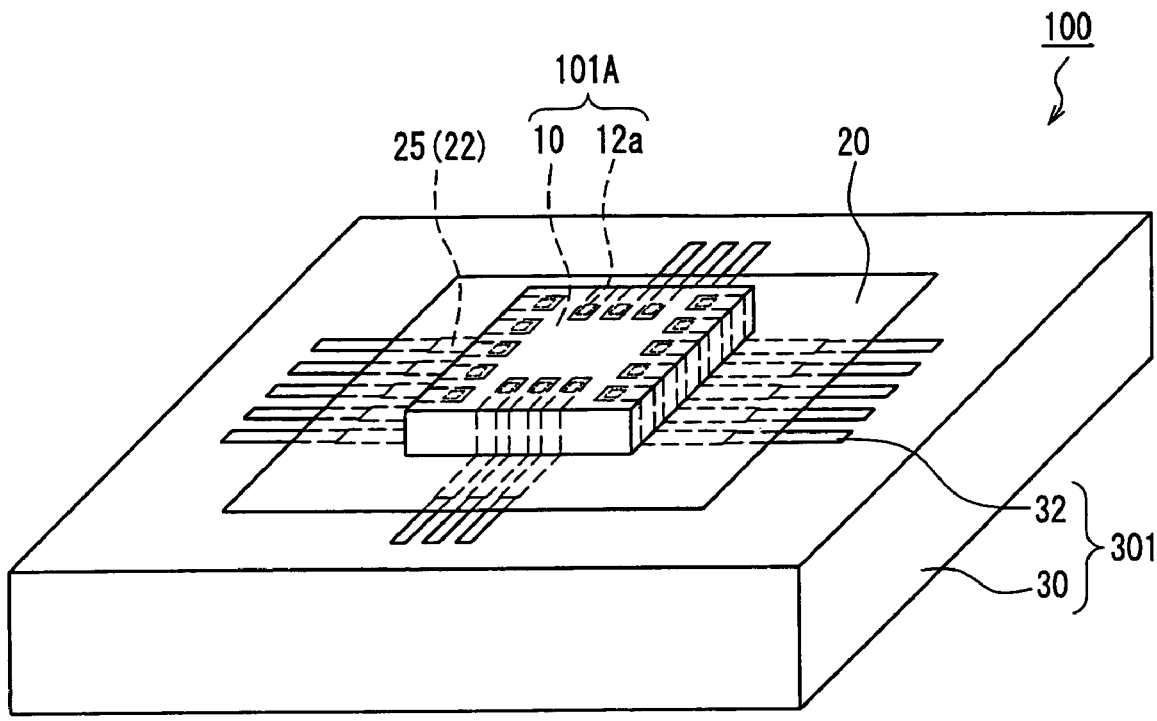
FIG. 2 is a perspective view schematically showing the semiconductor device in FIG. 1A.
Figure 3:
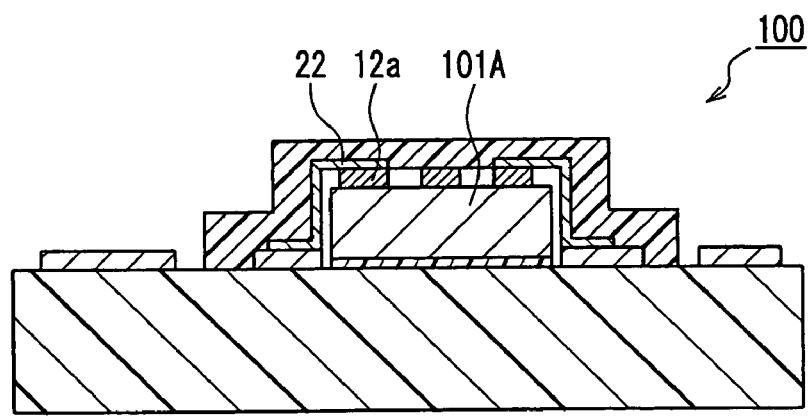
FIG. 3 is a cross-sectional view schematically showing another example of the semiconductor device of Embodiment 1 of the present invention.

A semiconductor device of the present embodiment will be described with reference to FIGS. 1A to 3. FIG. 1A is a cross-sectional view schematically showing the semiconductor device of the present embodiment, and FIG. 1B is a top view schematically showing the semiconductor device in FIG. 1A. FIG. 2 is a perspective view schematically showing the semiconductor device in FIG. 1A, and FIG. 3 is a cross-sectional view schematically showing another semiconductor device.

The semiconductor device 100 shown in FIGS. 1A, 1B, and 2 is constituted by a first semiconductor element 101A, a wiring board (interposer board) 301, a first film 20, and a second wiring layer 25. The first semiconductor element 101A has a first element body portion 10 and a first element electrode 12a that is provided on a first face 10a of the first element body portion 10. The first semiconductor element 101A is a bare chip, for example. The wiring board 301 includes an insulating substrate 30 and a first wiring layer 32 that is formed on one principal face of the insulating substrate 30. The wiring board 30 may be a rigid board (an example thereof is a typical printed board), for example.

As shown in FIG. 1A, the first semiconductor element 101A is disposed on the wiring board 301 such that a second face 10b of the first element body portion 10 that is opposite to the first face 10a is opposed to the face of the insulating substrate 30 on which the first wiring layer 32 is formed.

As shown in FIGS. 1A, 1B, and 2, the first film 20 covers at least a portion of a face of the first semiconductor element 101A that includes the surface of the first element electrode 12a (the face that is opposite to the second face 10b, i.e. the face including the first face 10a and the surface of the first element electrode 12a) and at least a portion of a face on the first semiconductor element 101A side of the wiring board 301.

The second wiring layer 25 is formed on a face on the wiring board 301 side of the first film 20. The second wiring layer 25 includes a plurality of first conductors 22 each having a first end and a second end. The first end of each first conductor 22 is in contact with a respective first element electrode 12a of the first semiconductor element 101A, and the second end is in contact with a portion of the first wiring layer 32. Accordingly, the first semiconductor element 101A and the wiring board 301 are electrically connected to each other by the second wiring layer 25.

Bonding of the first end of each first conductor 22 to the respective element electrode 12a and bonding of the second end of each first conductor 22 to the first wiring layer 32 are performed, for example, by using ultrasonic vibration. Bonding by using ultrasonic vibration is preferable in that bonding can be performed in a shorter period of time and at a lower temperature than in the case where bonding is performed by soldering, for example.

The semiconductor device 100 of the present embodiment having the structure as described above has various features and advantages described later, when compared to the semiconductor devices for which the WB method, the FC method, or the TAB method is employed.

In the semiconductor device 100 of the present embodiment, the first semiconductor element 101A and the wiring board 301 are arranged such that the face of the electrically insulating substrate 30 on which the first wiring layer 32 is formed is opposed to the second face 10b of the first element body portion 10, so that the first semiconductor element 101A can be bonded to the electrically insulating substrate 30 by die bonding. Thus, the heat dissipation of the semiconductor device 100 is superior to that of the semiconductor device for which the FC method is employed.

There is no particular limitation regarding a bonding material 13 (see FIG. 1A) that is used for die bonding, and bonding materials that have been conventionally used for die bonding can be employed. For example, die bonding films, polymer type conductive pastes, solders, and the like can be used as the bonding material.

Figure 17A:
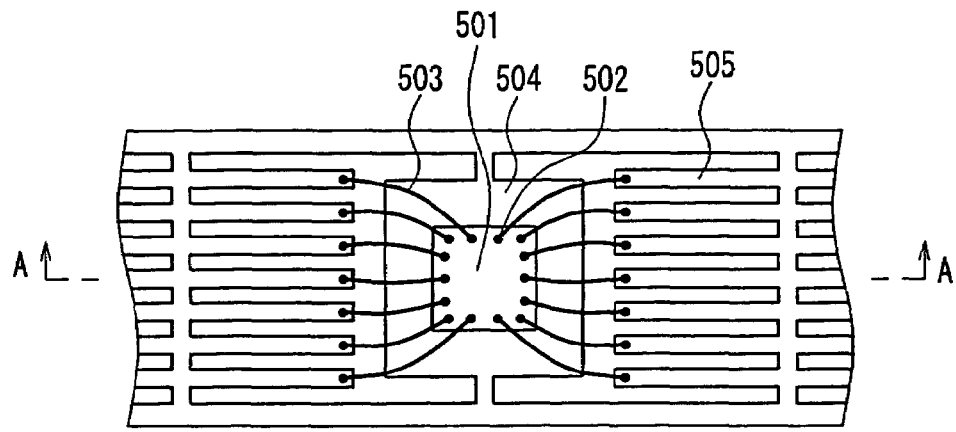
FIG. 17A is a top view for explaining a state in which a semiconductor chip and a lead frame are connected to each other by bonding wires.
Figure 17B:
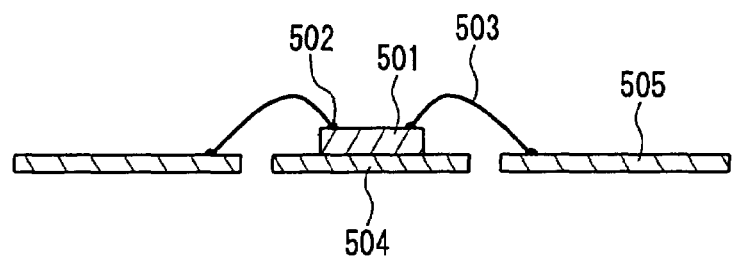
FIG. 17B is a cross-sectional view taken along the line A—A in FIG. 17A.
Figure 18:
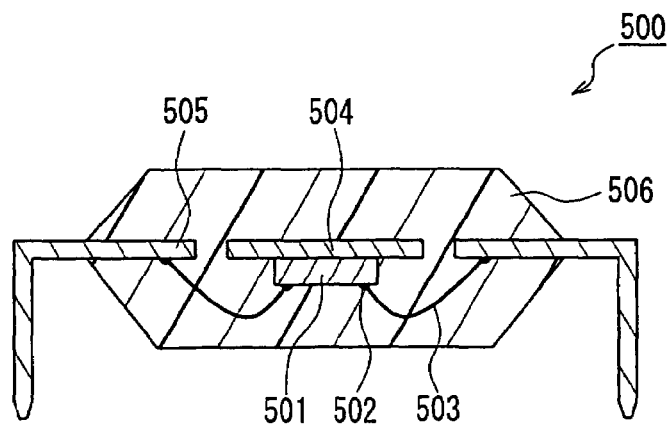
FIG. 18 is a cross-sectional view showing an example of a conventional semiconductor device for which the WB method is employed.
Figure 19:
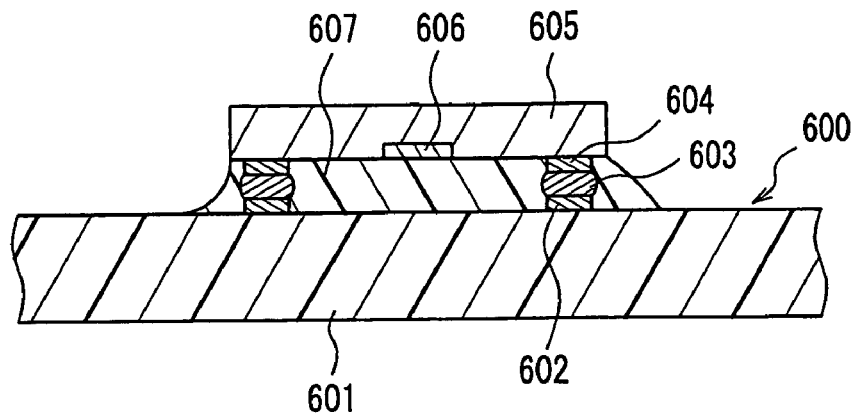
FIG. 19 is a cross-sectional view showing an example of a conventional semiconductor device for which the FC method is employed.
Figure 20:
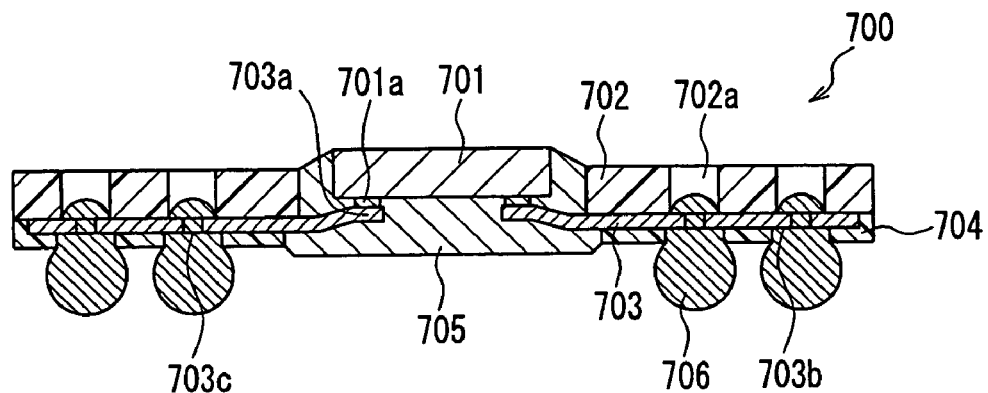
FIG. 20 is a cross-sectional view showing an example of a conventional semiconductor device for which the TAB method is employed.
Figure 21:
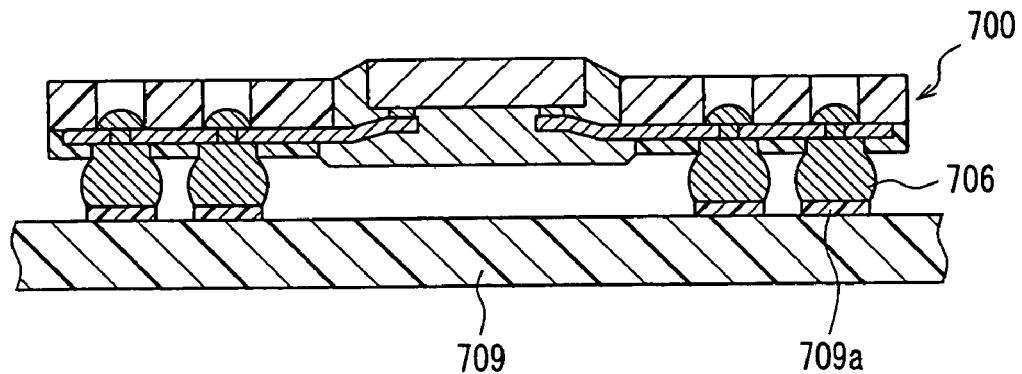
FIG. 21 is a cross-sectional view for explaining a state in which the semiconductor device shown in FIG. 20 is mounted on a mount board.
Figure 22:
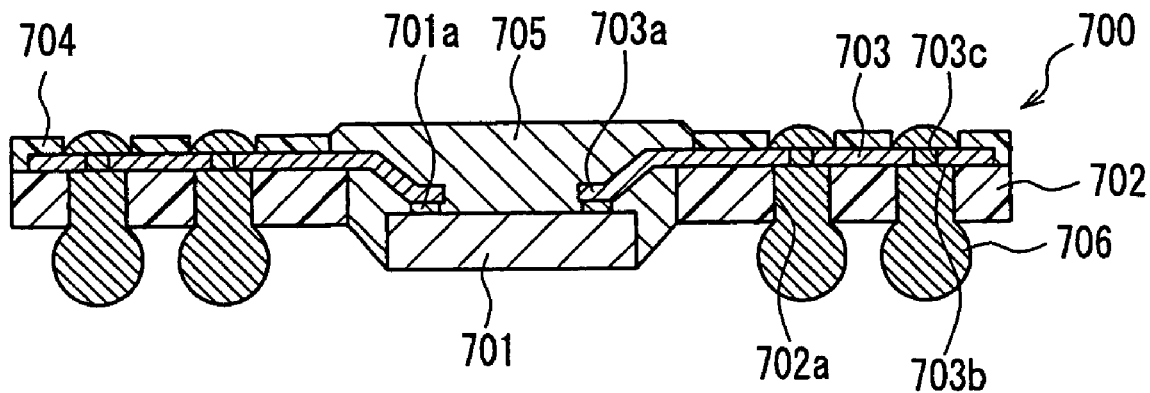
FIG. 22 is a cross-sectional view showing another example of the conventional semiconductor device for which the TAB method is employed.
Figure 23:
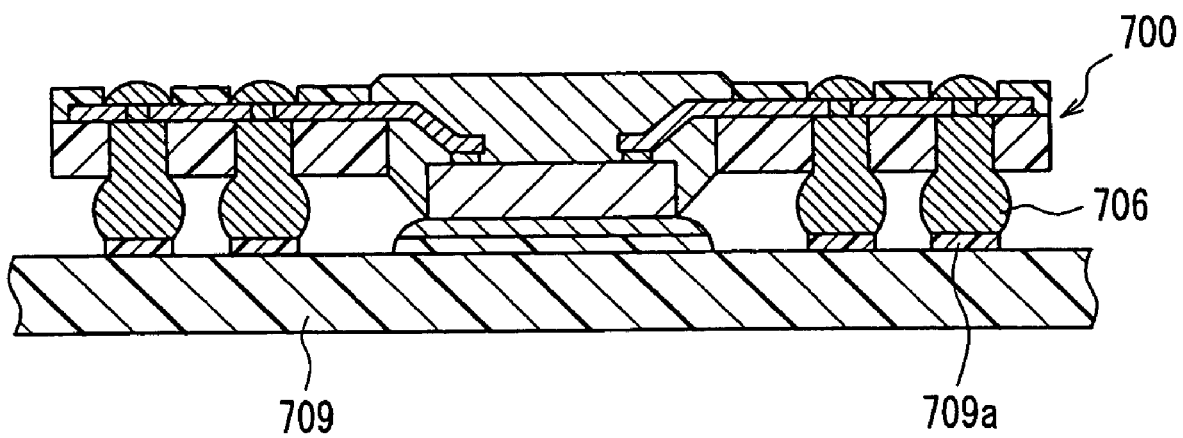
FIG. 23 is a cross-sectional view for explaining a state in which the conventional semiconductor device shown in FIG. 22 is mounted on the mount board.

Moreover, in the semiconductor device 100 of the present embodiment, the first semiconductor element 101A and the wiring board 301 are electrically connected to each other by the first conductors 22 of the second wiring layer 25. Thus, in the manufacturing process, there is no need to repeat the operation of connecting each wire bonding pad 502 to each external terminal 505 over and over again (see FIG. 17). In the semiconductor device 100, a plurality of first element electrodes 12a are electrically connected to the first wiring layer 32 by the second wiring layer 25, so that the time and effort required for the operation in the manufacturing process can be reduced more and also productivity can be higher than in the case of the semiconductor device for which the WB method is employed.

Moreover, in the semiconductor device 100 of the present embodiment, the spacing between the adjacent conductors can be smaller than in the semiconductor device for which the WB method is employed. The bonding wire is fixed only at its ends, and other portions of the bonding wire are not fixed. Thus, it is necessary to set the spacing between the adjacent bonding wires to such an amount that the adjacent bonding wires can be kept from making contact with each other due to a flow of the sealing resin during sealing with the sealing resin. On the other hand, in the semiconductor device 100, since the first semiconductor element 101 A and the wiring board 301 are electrically connected to each other by the second wiring layer 25 that is formed on the first film 20, it is not necessary to set the spacing between the adjacent conductors (bonding wires) to a larger value as in the case where the bonding wires are used. Therefore, the spacing between the conductors can be smaller than in the semiconductor device for which the WB method is employed.

Moreover, in the semiconductor device 100 of the present embodiment, since the first semiconductor element 101A and the wiring board 301 are electrically connected to each other by the first conductors 22 that are formed on the first film 20, the semiconductor device can be made thinner than the semiconductor device for which the WB method is employed.

Moreover, in the semiconductor device 100 of the present embodiment, an increase in the cost due to a reduction in the spacing between the adjacent conductors can be inhibited more than in the case of the semiconductor device for which the FC method is employed. In the semiconductor device for which the FC method is employed, a large number of terminals (portions of the wiring layer at which the wiring layer is connected to the bumps) are concentrated in a predetermined region of the wiring board, that is, a region that faces the semiconductor element. Accordingly, the wiring board often is required to have a multilayer structure. However, the use of the wiring board having a multilayer structure causes an increase in the cost. In the semiconductor device 100 of the present embodiment, the first semiconductor element 101A and the wiring board 301 are electrically connected to each other by the first conductors 22 constituting the second wiring layer 25 that is formed on the first film 20 and that has a desired pattern, so that the number of layers of the wiring board 301 can be smaller than in the semiconductor device for which the FC method is employed, and thus, an increase in the cost can be inhibited.

Moreover, in the semiconductor device 100 of the present embodiment, matching of the coefficient of linear thermal expansion of the first semiconductor element 101A and the coefficient of linear thermal expansion of the first film 20 can be less exact than in the case of the semiconductor device for which the FC method is employed. The reason for this is that the first film 20 is thinner than the wiring board. Another reason is that the first film 20 has flexibility and thus can absorb a stress that is caused by the difference between the coefficient of linear thermal expansion of the first film 20 and the coefficient of linear thermal expansion of the first semiconductor element 10A.

Moreover, in the semiconductor device 100 of the present embodiment, there is no need for the underfill agent (sealing resin) that is used in the semiconductor device for which the FC method is employed. Therefore, there is no need for the step of injecting the sealing resin, so that productivity is improved. Moreover, since the junctions between the first electrode terminals 12a and the first conductors 22 and the junctions between the first wiring layer 32 and the first conductors 22 are protected by the first film 20, the reliability of the electric connection also is high.

Moreover, in the semiconductor device 100 of the present embodiment, the first semiconductor element 10A and the wiring board 301 are electrically connected to each other by the first conductors 22, so that the semiconductor device 100 can be manufactured more easily than the semiconductor device produced by employing the TAB method, in which the inner lead bonding (ILB) step and the outer lead bonding (OLB) step have to be performed separately. Moreover, in the semiconductor device 100 of the present embodiment, there is no need for the step of sealing the semiconductor element with the sealing resin as in the semiconductor device for which the TAB method is employed, and thus productivity is improved.

In the semiconductor device 100 of the present embodiment, it is preferable that the first film 20 is substantially transparent. When the first film 20 is substantially transparent, the second wiring layer 25 can be seen through the first film 20. Moreover, the location of each first element electrode 12a can be checked through the first film 20. Thus, alignment of the first end of each first conductor 22 and each element electrode 12a and alignment of the second end of each first conductor 22 and the first wiring layer 32 can be easier than alignment of the bumps and the conductors of the wiring board in the semiconductor device for which the FC method is employed. Moreover, in the case of the semiconductor device for which the FC method is employed, it is difficult to check the state of connection by visual inspection. On the other hand, in the case of the semiconductor device 100 of the present embodiment, when the first film 20 is substantially transparent, the state of connection can be checked by visual inspection easily.

The first film 20 is made of a translucent insulating resin, for example. Examples of the above-mentioned resin include thermoplastic resins (polyimide, PPS (polyphenylene sulfide), polypropylene, polymethyl methacrylate, and the like). It is preferable that the thickness of the first film 20 is, for example, 10 μm to 100 μm, in particular, 50 μm or less. The first conductors 22 (the second wiring layer 25) formed on the first film 20 are made of copper, for example. It is preferable that the thickness of the first conductors 22 is 5 μm to 35 μm, for example. It should be noted that it is preferable that the thickness of the first semiconductor element (bare chip) 101A is 50 μm to 400 μm, for example.

As shown in FIGS. 1A, 1B, and 2, the first film 20 covers the first semiconductor element 101A and a portion (an area with which the first conductors 22 are in contact) of the first wiring layer 32 of the wiring board 301. Moreover, as shown in FIG. 1A, a portion of a face on the second wiring layer 25 side of a layered product 50 constituted by the first film 20 and the wiring layer 25 is adhered directly or indirectly to a face of the first semiconductor element 101A that includes the surface of the first element electrodes 12a. Thus, the junction between the first end of each first conductor 22 and each first element electrode 12a can be protected by the first film 20, so that connection stability preferably can be improved. When another portion of the face on the second wiring layer side of the layered product 50 that is different from the above-mentioned portion is adhered directly or indirectly to at least one of the four lateral faces of the first element body portion 10, connection stability preferably can be improved even more.

In the example shown in FIG. 1A, a portion of the face on the second wiring layer 25 side of the layered product 50 constituted by the first film 20 and the second wiring layer 25 is also adhered to the wiring board 301. That is to say, the face on the wiring board side of the layered product 50 is bonded directly or indirectly to the first semiconductor element 101A and the wiring board 301, and the first semiconductor element 101A is disposed within a closed space that is surrounded by the layered product 50 and the wiring board 301. Therefore, in the semiconductor device 100 shown in FIG. 1A, the connection stability of the junction between the second end of each first conductor 22 and the first wiring layer 32 also can be increased. Moreover, when a material having low water vapor permeability is used as the material of the first film 20, the first semiconductor element 101A can be protected against moisture, so that the moisture resistance of the semiconductor device can be improved. Examples of the material having low water vapor permeability include polyvinylidene chloride, polyethylene-vinyl alcohol, and the like, and a ceramic vapor deposition film that also has high transparency is particularly preferable.

Examples of the method for adhering the layered product 50 to the first element electrodes 12a, the first face 10a of the first element body portion 10, and the like include a method of attaching the first film 20 to the face of the first semiconductor element 101A that includes the surface of the first element electrodes 12a and then causing the first film 20 to thermally contract.

In the semiconductor device 100 shown in FIG. 1A, the first element electrodes 12a and the first conductors 22 are directly bonded to each other. However, they may be bonded to each other via intervening members such as bumps (e.g., solder bumps or gold bumps).

In the example shown in FIGS. 1B and 2, the first semiconductor element 101A has sixteen first element electrodes 12a. However, the number of first element electrodes 12a is not limited to this number, and can be more than or less than sixteen, for example. Moreover, in the example shown in FIGS. 1B and 2, the first semiconductor element 101A has a structure in which the first element electrodes 12a are arranged at the periphery of the first element body portion 10. However, the first semiconductor element 101A is not limited to this structure, and the first semiconductor element 101A can have a structure in which the first element electrodes 12a are arranged in an array pattern (grid pattern).

Moreover, in the example shown in FIGS. 1 and 2, the first conductors 22 are in contact with the lateral faces of the first semiconductor element 101A (the first element body portion 10). However, the semiconductor device of the present embodiment is not limited to such a configuration, and the first conductors 22 do not have to be in contact with the lateral faces of the first semiconductor element 101A, as in the semiconductor device 100 shown in FIG. 3. Moreover, the entire first element electrode 12a may be covered with the first end of the first conductor 22, as shown in FIGS. 1A and 1B, or only the top face of the first element electrode 12a may be in contact with the first end of the first conductor 22, as shown in FIG. 3.

Next, an example of the method for manufacturing the semiconductor device 100 of the present embodiment will be described with reference to FIGS. 4A to 6B.

Figure 4A:
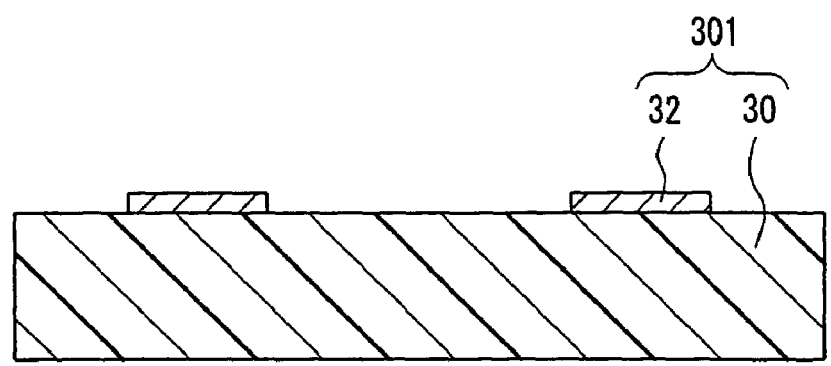
FIGS. 4A and 4B are cross-sectional views showing a process sequence for explaining an example of a method for manufacturing the semiconductor device of Embodiment 1.

First, as shown in FIG. 4A, the wiring board 301 in which the first wiring layer 32 is formed on one principal face of the insulating substrate 30 is prepared. The wiring board 301, which may be a rigid board, is a glass-epoxy board (made by impregnating a glass woven fabric with epoxy resin), for example. The wiring board 301 may be a resin based board such as a BT (bismaleimide triazine) board, a paper-phenolic resin board, or an aramid-epoxy board (made by impregnating an aramid substrate with epoxy resin), or may be a ceramic based board such as an alumina board or a glass-alumina board.

The wiring board 301 shown in FIG. 4A is a single-sided board in which the wiring layer is formed only on one principal face of the insulating substrate 30, but there is no limitation to this. The wiring board 301 may be a double-sided board in which wiring layers are formed on both of the principal faces of the insulating substrate 30, or may be a multilayer board in which a wiring layer is provided also inside the insulating substrate. The first wiring layer 32 is made of a copper foil, for example.

Figure 4B:
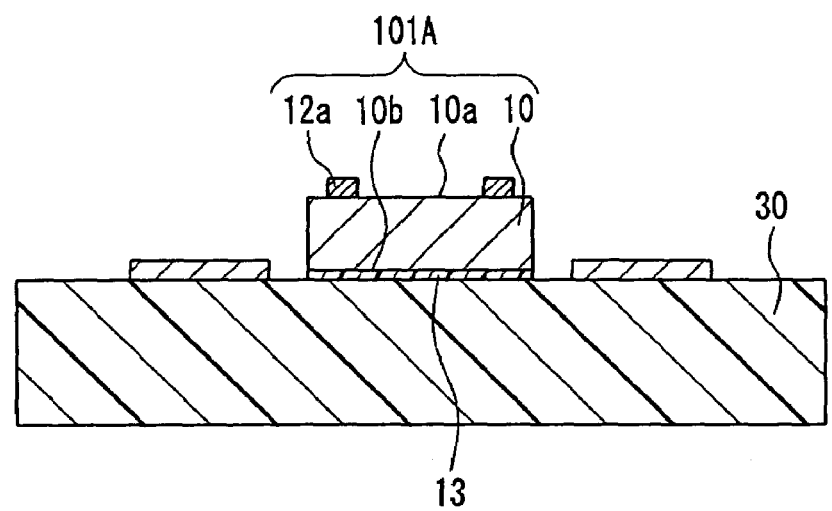

Next, as shown in FIG. 4B, the first semiconductor element 101A in which the first element electrodes 12a are provided on the first face 10a of the first element body portion 10 is prepared. Then, the first semiconductor element 101A is die-bonded to the wiring board (insulating substrate 30) using the bonding material 13 such that the second face 10b of the first semiconductor body portion 10 faces the insulating substrate 30 of the wiring board. The first semiconductor element 101A is a so-called bare chip, for example. The first element electrodes 12a are made of, for example, aluminum or an alloy (e.g., Al—Cu or Al—Cu—Si) that contains aluminum as the main component.

Figure 5A:
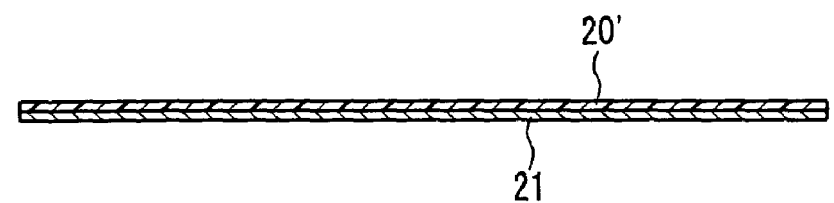
FIGS. 5A and 5B are cross-sectional views showing a process sequence for explaining the example of the method for manufacturing the semiconductor device 1 of Embodiment 1.
Figure 5B:
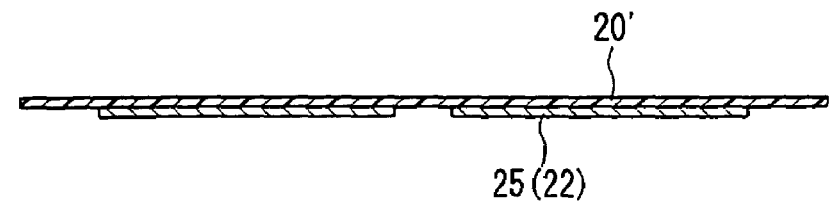

On the other hand, a sheet in which the second wiring layer is formed on one principal face of a film is formed, as shown in FIGS. 5A and 5B. First, a metal layer 21 is formed on the film 20', as shown in FIG. 5A. Examples of the material of the film 20' include polyimide, PPS (polyphenylene sulfide), polypropylene, and polymethyl methacrylate. The film 20' shown in FIG. 5A is made of a transparent material such as polymethyl methacrylate. The metal layer 21 is a copper foil, for example. The metal layer 21 can be formed on the film 20' by attaching a metal foil or by metal plating, for example. The thickness of the film 20' is about 10 μm to 100 μm, for example, and the thickness of the metal layer 21 is about 5 μm to 35 μm, for example.

Next, the metal layer 21 is etched so that a predetermined pattern can be obtained, and thus, the second wiring layer 25 including the fist conductors 22 is formed on one principal face of the film 20', as shown in FIG. 5B. Etching can be performed, for example, by masking predetermined regions using a photoresist and then chemically removing unnecessary portions of the metal layer 21 using ferric chloride or copper chloride.

Figure 6A:
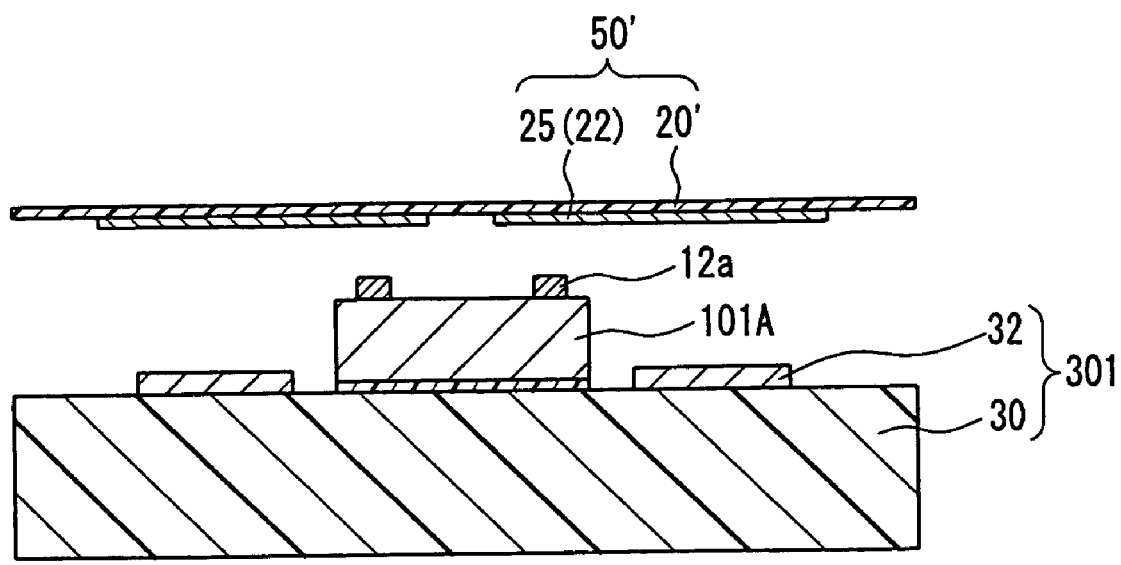
FIGS. 6A and 6B are cross sectional views showing a process sequence for explaining the example of the method for manufacturing the semiconductor device 1 of Embodiment 1.

Next, as shown in FIG. 6A, the face of the first semiconductor element 101A that includes the surface of the first element electrodes 12a and a portion of a face on the first semiconductor element 101A side of the wiring board 301 are covered with the sheet 50' that is constituted by the second wiring layer 25 and the film 20'. At this time, alignment is performed so that the first end of each first conductor 22 constituting the second wiring layer 25 can be in contact with a respective first element electrode 12a and the second end of each first conductor 22 can be in contact with a portion of the first wiring layer 32 of the wiring board 301. This alignment can be performed easily when the film 20' is substantially transparent. It should be noted that a bump may be formed on each of the first element electrodes 12a, and the first element electrodes 12a may be bonded to the first end of the first conductors 22 via the bumps.

Figure 6B:
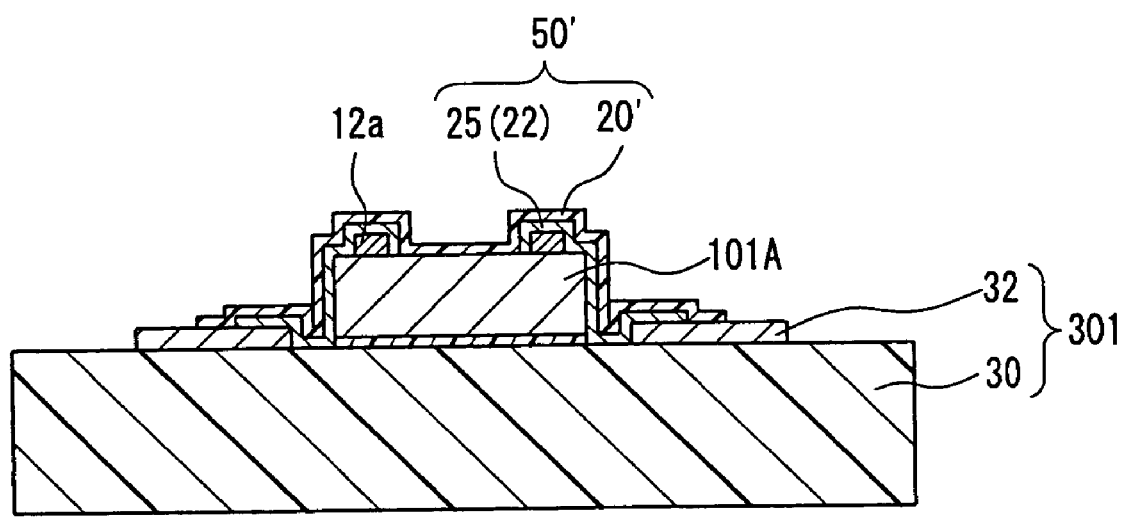

Next, as shown in FIG. 6B, the sheet 50' that is constituted by the film 20' and the second wiring layer 25 is adhered to the entire surface of the first semiconductor element 101A excluding the face that is in contact with the wiring board 301, and to a portion of the face on the first semiconductor element 101A side of the wiring board 301. An example of the adhesion method is a method using thermal contraction of the film 20'. When causing the film 20' to thermally contract, ambient pressure may be reduced.

Moreover, when the sheet 50' is adhered to the first semiconductor element 101A and the like using thermal contraction of the film 20', it is necessary to form the second wiring layer 25 on the film 20', giving consideration to the amount of thermal contraction of the film 20', such that the first ends of the first conductors 22 and the first element electrodes 12a, and the second ends of the first conductors 22 and the first wiring layer 32 can be electrically connected to each other after the thermal contraction. For example, it is sufficient that, giving consideration to the amount of thermal contraction of the film 20', the spacing of a plurality of first conductors 22 that are contained in the second wiring layer 25 is set to a larger value.

It is also possible, for example, to apply an adhesive partially to a face of the film 20' that is in opposition to the first semiconductor element 101A and the like so that the sheet 50' can be adhered to the first semiconductor element 101A and the like easily. In FIGS. 6A and 6B, numeral 30 denotes the insulating substrate.

Next, the first ends of the first conductors 22 and the first element electrodes 12a, and the second ends of each first conductor 22 and a portion of the first wiring layer 32 may be collectively bonded to each other by using ultrasonic vibration, for example. Bonding of the first ends of the first conductors 22 to the first element electrodes 12a and bonding of the second ends of the first conductor 22 to a portion of the first wiring layer 32 also can be performed, in either case, by soldering and the like.

In the method for manufacturing the semiconductor device of the present embodiment, the following process also can be employed. First, the film 20' containing a thermosetting resin that has not been cured is used, and after the sheet 50' is processed into a predetermined shape, the sheet 50' is processed into a shape with which the sheet 50' can cover the face the first semiconductor element 101A that comprises the surface of the first element electrodes 12a and at least a portion of the face on the first semiconductor element 101A side of the wiring board 301 by curing the thermosetting resin by heating. Then, the first end of each first conductor 22 is bonded to a respective first element electrode 12a and the second end of each first conductor 22 is bonded to a portion of the first wiring layer 32.

In the method for manufacturing the semiconductor device of the present embodiment that is described using FIGS. 4A to 6B, bonding of the first end of each first conductor 22 to the respective first element electrode 12a and bonding of the second end of each first conductor 22 to a portion of the first wiring layer 32 are performed after the first semiconductor element 101A and the wiring board 301 are bonded to each other. However, the method for manufacturing the semiconductor device of the present embodiment is not limited to this method. For example, it is also possible to bond the first semiconductor element 101A and the wiring board 301 after the first end of each first conductor 22 is bonded to the respective first element electrode 12a. It is preferable that the second end of each first conductor 22 is bonded to the respective first element electrode 12a before the first semiconductor element 101A and the wiring board 301 are bonded to each other because alignment of the first end of each first conductor 22 and each first element electrode 12a can be made easily.

Next, other examples of the semiconductor device 100 of the present embodiment will be described with reference to FIGS. 7 to 11.

Figure 7:
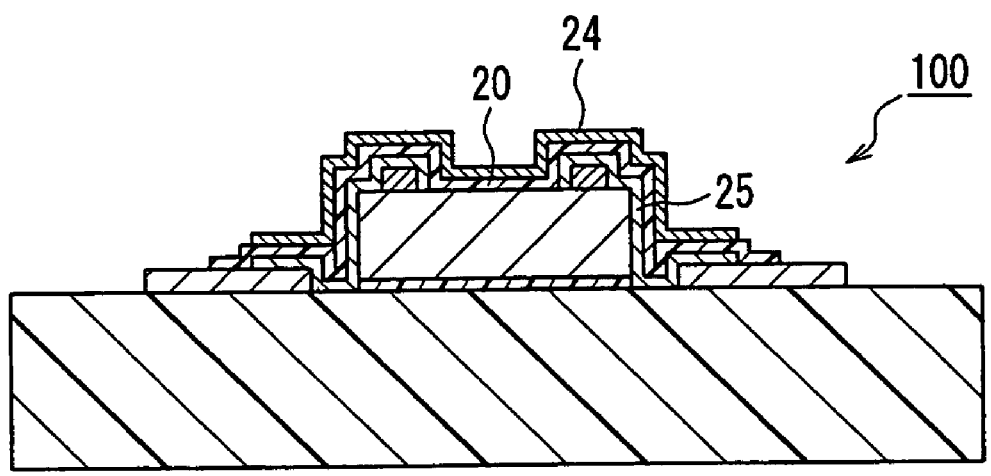
FIG. 7 is a cross-sectional view schematically showing another example of the semiconductor device of Embodiment 1 of the present invention.

In the semiconductor device 100 shown in FIG. 7, an electromagnetic shielding layer 24 is formed on a face of the first film 20 that is opposite to the face on which the second wiring layer 25 is formed, so that it is possible to inhibit external radiation of electromagnetic noise that is radiated from the first semiconductor element. The electromagnetic shielding layer 24 is formed over almost the entire surface of the above-mentioned opposite face. Examples of the material of the electromagnetic shielding layer 24 include at least one selected from the group consisting of copper, nickel, gold, iron, silver, and ferrite.

Figure 8:
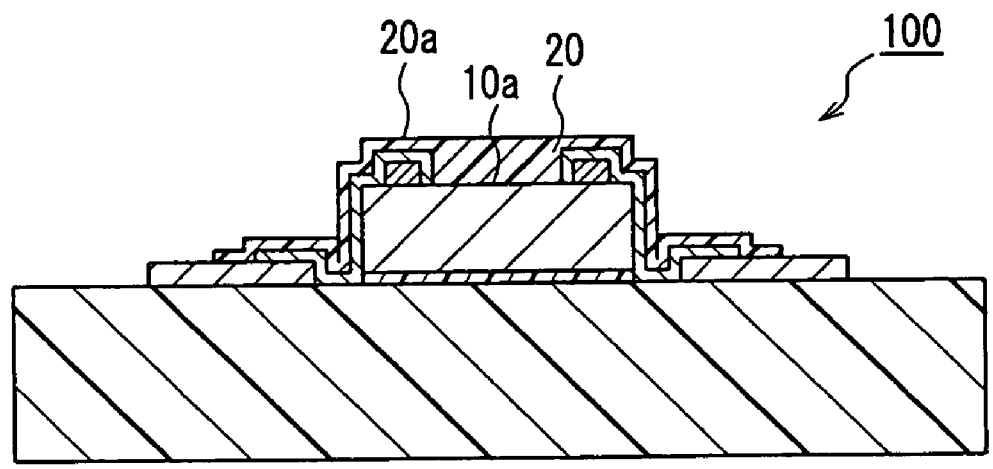
FIG. 8 is a cross-sectional view schematically showing another example of the semiconductor device of Embodiment 1 of the present invention.
Figure 9:
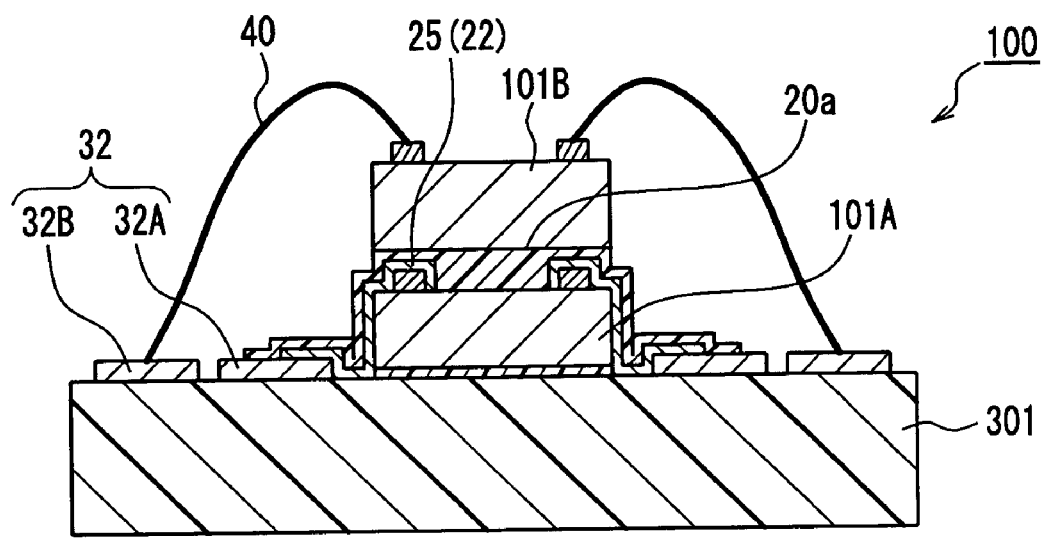
FIG. 9 is a cross-sectional view schematically showing another example of the semiconductor device of Embodiment 1 of the present invention.

In the semiconductor device 100 shown in FIG. 8, a face of the first film 20 that is opposite to a face on the wiring board 30 side of the first film 20 includes a flat surface 20a having an area that is equal to or larger than the area of the first face 10a of the first element body portion. When the first film 20 includes the above-mentioned flat surface 20a in this manner, it is possible to dispose an electronic component (in this example, a second semiconductor element 101B) on this flat surface 20a easily, as shown in FIG. 9. It should be noted that it is sufficient that the flatness of the above-mentioned flat surface 20a is at such a level that the second semiconductor element 101B can be disposed easily.

In order to make the face of the first film 20 that is opposite to the face on the wiring board 30 side of the first film 20 flat, it is possible, for example, to press the film 20' (see FIG. 6A), which will constitute the first film 20, while the film 20' is being softened by heating.

The semiconductor device 100 shown in FIG. 9 includes two semiconductor elements, and the second semiconductor element 101B is disposed above the first semiconductor element 101A. The first semiconductor element 101A is connected to a portion 32A of the first wiring layer by the first conductors 22 of the second wiring layer 25. The second semiconductor element 101B is connected, by bonding wires 40, to another portion 32B of the first wiring layer 32 that is different from the portion 32A of the first wiring layer 32 with which the first conductors 22 are in contact.

The semiconductor device 100 shown in FIG. 9 has advantages as described below over a semiconductor device in which both of the first semiconductor element 101A and the second semiconductor element 101B are electrically connected to the wiring board 301 using the WB method. In the semiconductor device in which both of the first semiconductor element 101A and the second semiconductor element 101B are electrically connected to the wiring board 301 using the WB method, it is difficult to employ a stack structure in which a plurality of semiconductor elements having almost the same size are arranged one above the other as in the semiconductor device 100 shown in FIG. 9. The reason for this is that when a plurality of semiconductor elements having almost the same size are arranged one above the other, it is difficult to connect the first element electrodes of the semiconductor element that is arranged below another semiconductor element to the first wiring layer by the bonding wires. On the contrary, in the semiconductor device 100 of the present embodiment, the first semiconductor element 101A is electrically connected to the wiring board 301 via the first conductors 22, as shown in FIG. 9, so that it is easy to employ a stack structure in which the first semiconductor element 101A and the second semiconductor element 101B that have substantially the same size are arranged one above the other.

Moreover, when both of the first semiconductor element 101A and the second semiconductor element 101B are electrically connected to the wiring board 301 using the WB method, the height of the loop of the bonding wires connected to the first semiconductor element 10A that is arranged below the second semiconductor element 101B has to be decreased as much as possible. However, in the semiconductor device 100 of the present embodiment, the first semiconductor element 101A is connected to the wiring board 301 without using the bonding wires, and the first semiconductor element 101A is electrically connected to the wiring board 301 via the first conductors 22, so that there is no need for giving consideration to the height of the loop.

Figure 10:
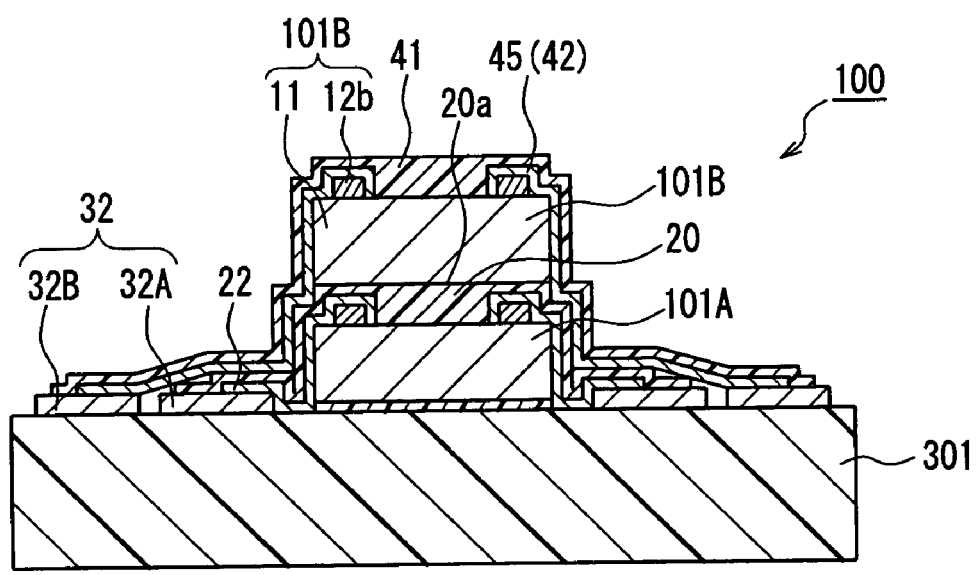
FIG. 10 is a cross-sectional view schematically showing another example of the semiconductor device of Embodiment 1 of the present invention.

When the second semiconductor element 101B is disposed on the first film 20, the semiconductor device 100 may have a configuration as shown in FIG. 10. In the semiconductor device 100 shown in FIG. 10, the second semiconductor element 101B is disposed on the first film 20 such that a face of the second semiconductor element 101B that is opposite to a face that includes the surface of second element electrodes 12b is opposed to the flat surface 20a of the first film 20.

The semiconductor device 100 shown in FIG. 10 includes a second film 41 and a fourth wiring layer 45 that is formed on a face on the wiring board 301 side of the second film 41 and that includes second conductors 42. Each of the second conductors 42 has a first end and a second end. The second film 41 covers the face of the second semiconductor element 101B that includes the surface of the second element electrodes 12b (the face that includes the surface of the second element electrodes 12b and a face of a second element body portion 11 that is opposite to the face on the first film 20 side of the element body portion 11) and a portion of the face on the second semiconductor element 101B side of the wiring board 301, from the second element electrodes 12b side.

The first end of each second conductor 42 is in contact with each second element electrode 12b, and the second end of each second conductor 42 is in contact with another portion 32B of the first wiring layer 32 that is different from the portion 32A of the first wiring layer 32 with which the second end of each first conductor 22 is in contact. It should be noted that the semiconductor device 100 shown in FIG. 10 has a stack structure in which the two semiconductor elements 101A and 101B are stacked. However, there is no particular limitation regarding the number of semiconductor elements, and it is also possible that three or more semiconductor elements are stacked.

Figure 11A:
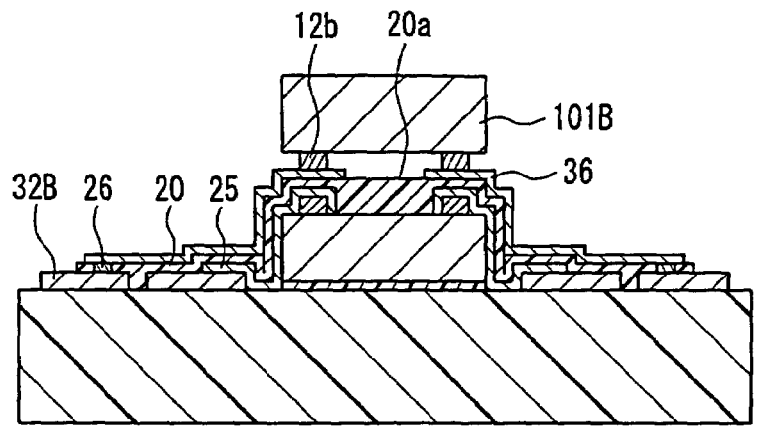
FIG. 11A is a cross-sectional view schematically showing another example of the semiconductor device of Embodiment 1 of the present invention.
Figure 11B:
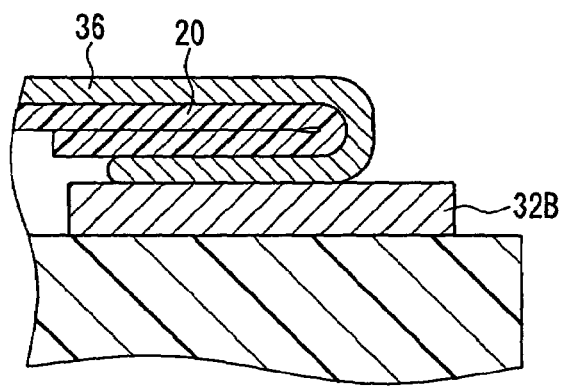
FIG. 11B is an enlarged view of a portion of the another example of the semiconductor device of Embodiment 1 of the present invention.

As shown in FIGS. 11A and 11B, if a third wiring layer 36 is formed on a face of the first film 20 that is opposite to the face on which the second wiring layer 25 is formed and one end of each of conductors constituting the third wiring layer 36 is arranged on the flat surface 20a of the first film, then it is also possible to mount the second semiconductor element 101B on one end of each of these conductors by the flip chip method. The other end of each of the above-mentioned conductors can be electrically connected to the portion 32B of the first wiring layer, for example, through a via 26 that is provided in the first film 20.

It is also possible to electrically connect the conductors that constitute the third wiring layer 36 to the portion 32B of the first wiring layer by folding an end portion of layered product constituted by the first film 20 and the third wiring layer 36, as shown in FIG. 11B, instead of providing the via 26 in the first film 20.

In all of the semiconductor devices of the present embodiment that are described with reference to FIGS. 1A to 11B, the first semiconductor element is bonded to the wiring board via the bonding material. However, for example, if the first semiconductor element is secured at a predetermined position with the first film, then there is no need for bonding the first semiconductor element to the wiring board.

Embodiment 2

Next, an example of a semiconductor device 200 of Embodiment 2 will be described with reference to FIGS. 12 to 16.

Figure 12:
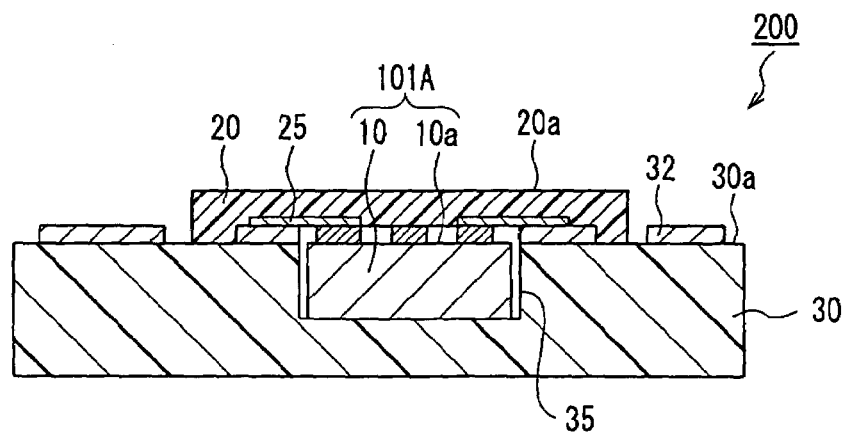
FIG. 12 is a cross-sectional view schematically showing an example of a semiconductor device of Embodiment 2 of the present invention.

As shown in FIG. 12, in the semiconductor device 200 of the present embodiment, a recessed portion 35 is formed on the first face side of the insulating substrate 30, and the first semiconductor element 101A is disposed in the recessed portion 35. The semiconductor device 200 is different from the semiconductor device of Embodiment 1 in this respect. In other respects, the semiconductor device 200 is similar to the semiconductor device of Embodiment 1, and thus the description thereof will be omitted.

In the semiconductor device 200 of the present embodiment, the first semiconductor element 101A is disposed in the recessed portion 35, so that irregularities in the contour of the semiconductor device 200 can be reduced. Moreover, the thickness of the semiconductor device 200 also can be reduced.

As shown in FIG. 12, it is preferable that the first face 10a of the first element body portion 10 of the first semiconductor element 101A is on substantially the same plane with a face 30a of the insulating substrate 30 on which the first wiring layer 32 is formed. This is because irregularities in the contour of the semiconductor device 200 can be reduced even more. With the use of the semiconductor device 200 shown in FIG. 12, it is possible, for example, to reduce the complexity of the layout when designing a mobile device or the like, for which a reduction in thickness is desired.

Moreover, in the semiconductor device 200 shown in FIG. 12, almost the entire surface of the face of the first film 20 that is opposite to the face on which the second wiring layer 25 is formed constitutes the flat surface 20a. Thus, an electronic component can be disposed easily on the above-mentioned flat surface 20a of the first film 20.

Figure 13:
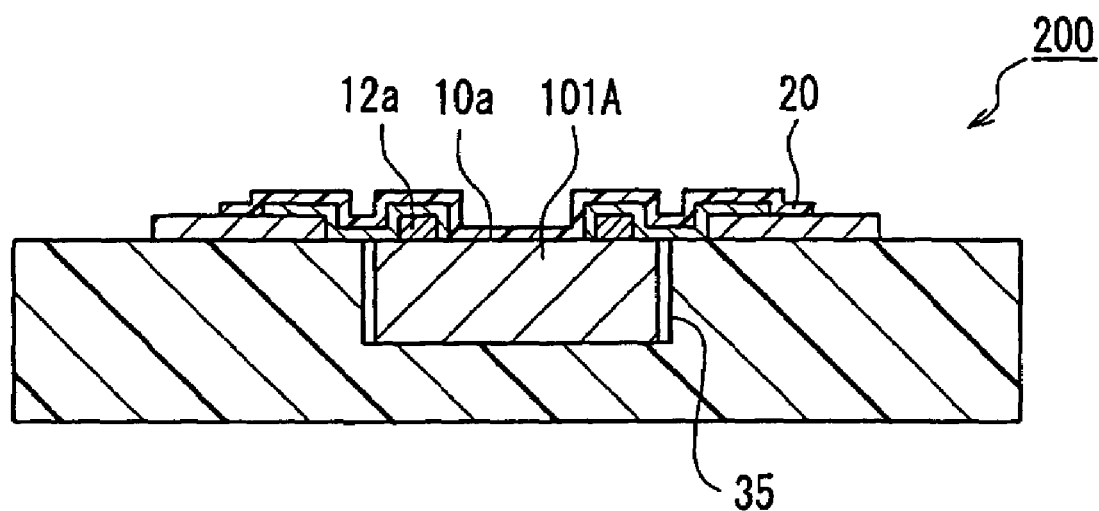
FIG. 13 is a cross-sectional view schematically showing another example of the semiconductor device of Embodiment 2 of the present invention.

As shown in FIG. 13, when the first film 20 is adhered to a region of the first face 10a of the first element body portion that lies between the first element electrodes 12a, it is possible to increase the withstand voltage between the first element electrodes 12a.

Figure 14:
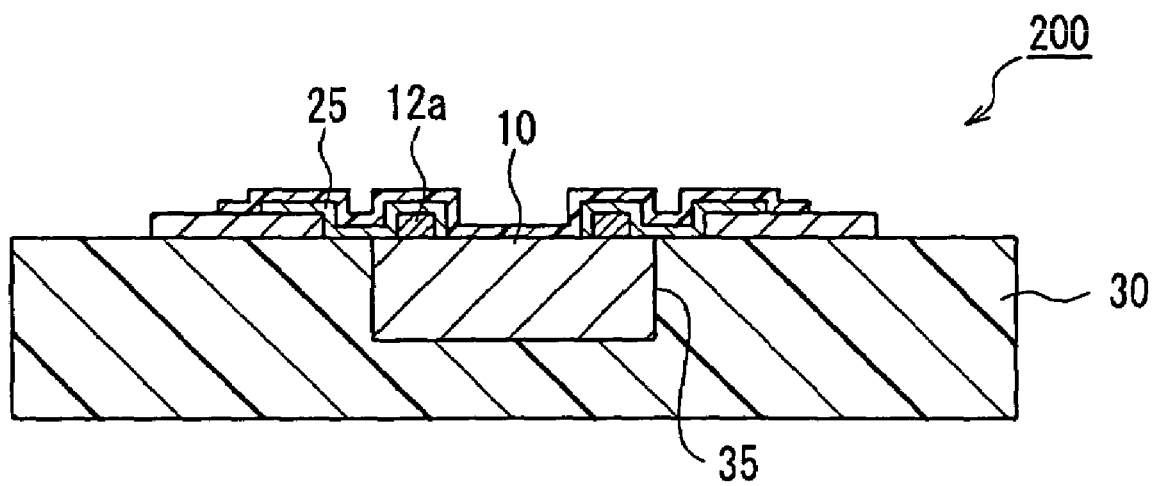
FIG. 14 is a cross-sectional view schematically showing another example of the semiconductor device of Embodiment 2 of the present invention.

In the semiconductor device 200 shown in FIG. 13, there is a gap between the recessed portion 35 and the first semiconductor element 101A. However, as shown in FIG. 14, it is also possible to eliminate the gap between the recessed portion 35 and the first semiconductor element by making the shape of the recessed portion 35 and that of the first element body portion 10 of the first semiconductor element almost identical. When the shape of the recessed portion 35 is almost identical with that of the first element body portion 10, alignment of the first element electrodes 12a and the second wiring layer 25 can be made easily. Moreover, when the insulating substrate 30 is in contact with the lateral faces of the first electrode body portion 10, the heat dissipation of the first semiconductor element can be increased.

Figure 15:
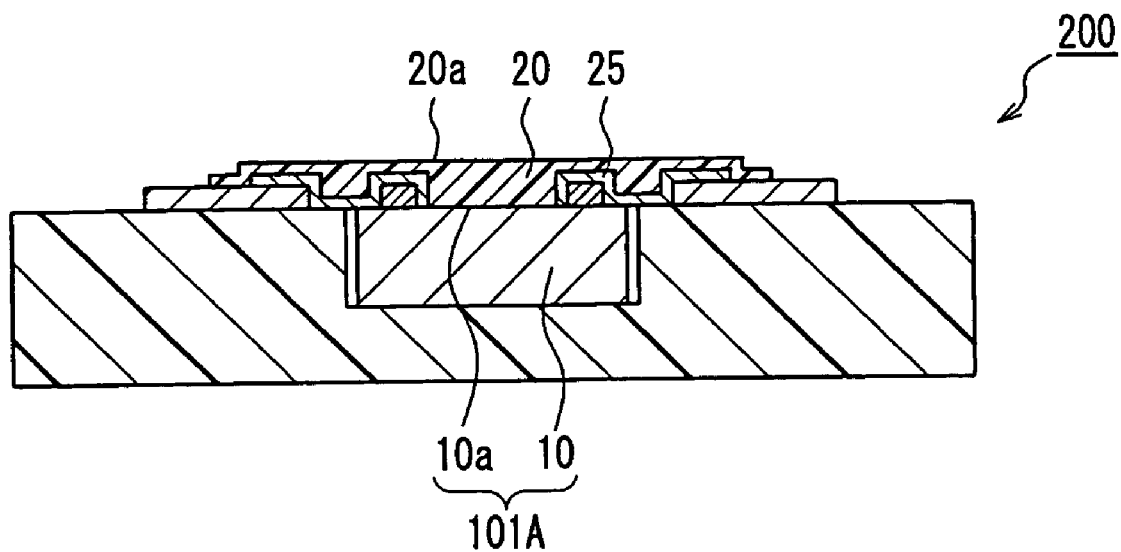
FIG. 15 is a cross-sectional view schematically showing another example of the semiconductor device of Embodiment 2 of the present invention.

Moreover, as shown in FIG. 15, it is also possible that almost the entire surface of the face of the first film 20 that is opposite to the face on which the second wiring layer 25 is formed constitutes the flat surface 20a, and that the area of the flat surface 20a is larger than that of the first face 10a of the first element body portion 10 of the first semiconductor element 101A. In this case, for example, another semiconductor element having a larger area than the first semiconductor element 101A when viewed from top, or a plurality of semiconductor elements, can be disposed on the above-mentioned flat surface 20a of the first film 20.

Figure 16:
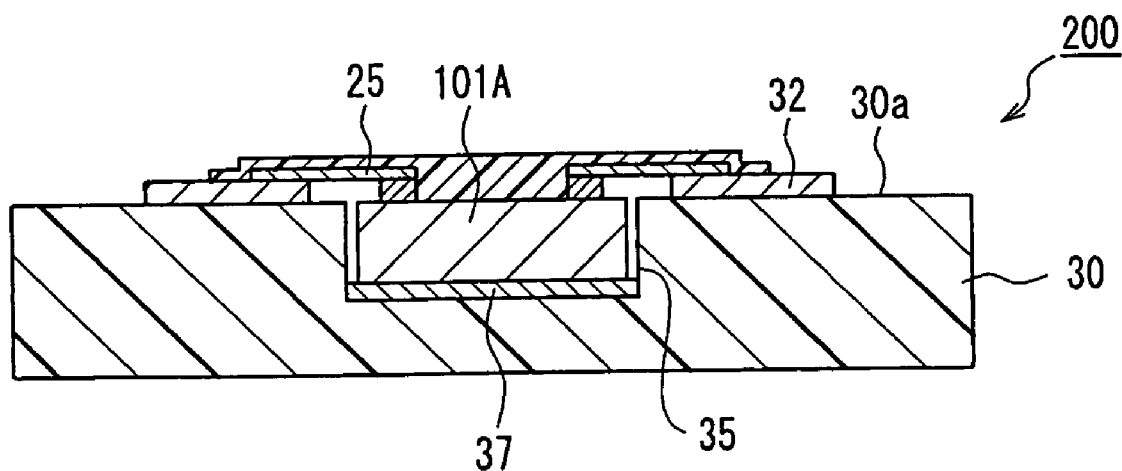
FIG. 16 is a cross-sectional view schematically showing another example of the semiconductor device of Embodiment 2 of the present invention.

As shown in FIG. 16, disposing the second wiring layer 25 such that the second wiring layer 25 is substantially parallel to the face 30a of the insulating substrate 30 on which the first wiring layer 32 is formed is advantageous in achieving rapid response because the wiring length can be reduced.

Also the semiconductor device 200 of the present embodiment may have a stack structure in which two or more semiconductor elements are contained, as in the case with the semiconductor device of Embodiment 1. In the semiconductor device of the present embodiment, the first semiconductor element 101A is disposed in the recessed portion 35, so that even if the semiconductor device has a stack structure, the height thereof can be lower than that of the semiconductor device of Embodiment 1, and thus a reduction in thickness can be achieved.

As shown in FIG. 16, in the semiconductor device 200 of the present embodiment, it is also possible that a metal layer 37 is disposed on the bottom of the recessed portion 35 and the first semiconductor element 101A is disposed on the metal layer 37. When the first semiconductor element 101A is disposed on the metal layer 37, the metal layer 37 functions as a heat sink, and thus the heat dissipation of the first semiconductor element 101A can be increased.

In Embodiments 1 and 2, the entire surface of the face of the first semiconductor element 101A that includes the surface of the first element electrodes 12a is covered with the first film 20. However, it is also possible that a portion of the face of the first semiconductor element 101A that includes the surface of the first element electrodes 12a is covered with the first film 20. Moreover, in the example shown in FIG. 10, the entire surface of the face of the second semiconductor element 101B that includes the surface of the second element electrodes 12b is covered with the second film 41. However, it is also possible that a portion of the face of the second semiconductor element 101B that includes the surface of the second element electrodes 12b is covered with the second film 41.

In Embodiments 1 and 2, the cases in which the first semiconductor element 101A is a bare chip are described. However, the semiconductor element is not limited to a bare chip. The first semiconductor element 101A may have a chip size package (CSP) structure, for example.

Moreover, typically, the first semiconductor element 101A is a memory IC chip, a logic IC chip, or a system LSI chip. However, it may be a light emitting diode (LED) chip. When a LED chip is used as the first semiconductor element 101A and the first film 20 is substantially transparent to the light that is emitted from the LED, a light emitting device (semiconductor device) can be provided.

When a LED chip is used as the first semiconductor element 101A, and when a phosphor is dispersed in the first film 20, a light emitting device that uses both of the outgoing light from the LED chip and the light that is emitted from the phosphor can be provided.

When the semiconductor devices of Embodiments 1 and 2 are white light emitting devices, a blue LED chip that emits blue light can be used as the first semiconductor element 101A and a phosphor can be dispersed in the first film 20. As the phosphor, a phosphor that converts blue light into yellow light can be used. In this manner, white light can be obtained by using blue light and yellow light. In this case, for example, a LED chip made of gallium nitride (GaN)

based material can be preferably used as the LED chip, and $(Y-Sm)_3(Al-Ga)_5O_{12}:Ce$, $(Y_{0.39}Gd_{0.57}Ce_{0.03}Sm_{0.01})_3Al_5O_{12}$, or the like can be preferably used as the phosphor.

As the first semiconductor device 101A, an ultraviolet LED chip that emits ultraviolet light also can be used in addition to the blue LED chip. In this case, when a phosphor that emits light in red (R), green (G), and blue (B) colors when excited by the light generated from the ultraviolet LED chip is dispersed in the first film 20, a white light emitting device can be achieved. In this manner, by selecting the type of the LED chip and the type of the phosphor appropriately, a light emitting device that emits light of a desired color can be achieved.

Moreover, the wiring board may be a glass board that is provided with a glass plate and a wiring layer containing a conductive material (e.g., indium-tin oxide) having high transparency. When a translucent glass plate is used for the wiring board, and a film that is substantially transparent to incident light is used as the first film, a translucent semiconductor device that is capable of transmitting incident light from the first semiconductor element 101A side to the wiring board side can be provided. Moreover, in this case, when a LED chip or the like is used as the first semiconductor element 101A, the light emerging from the LED chip can be transmitted to the wiring board side. The translucent semiconductor device is useful, for example, as a component of liquid crystal displays and the like, and can transmit the light emerging from a backlight.

Hereinafter, examples of the semiconductor device of the present invention will be described in greater detail, but the semiconductor device of the present invention is not limited to examples below.

EXAMPLE 1

First, a wiring board (manufactured by KYOCERA Corporation) made of glass-alumina ceramic and having a thickness of 0.4 mm was prepared. The wiring layer of this wiring board is constituted by a copper layer and an electroless nickel plating layer and an electroless gold plating layer that are formed on the copper layer.

Next, a semiconductor element having an outside dimension of 4 mm square and a thickness of 0.15 mm was prepared. This semiconductor element was bonded to the wiring board via a die bonding film (NEX-130, manufactured by Nippon Steel Chemical Co., Ltd.). Then, bumps were formed on element electrodes of the semiconductor element using a gold wire having a size of 30 μm.

On the other hand, a laminated film (manufactured by Nippon Steel Chemical Co., Ltd.) constituted by a polyimide film having a thickness of 25 μm and a copper foil bonded to the polyimide film and having a thickness of 9 μm was prepared, and the copper foil was subjected to patterning so that it had a predetermined shape. Then, the copper foil that was subjected to patterning was plated with nickel and with gold, and thus a sheet was formed in which a wiring layer was formed on one principal face of the polyimide film.

Next, the sheet was disposed on the semiconductor element such that each element electrode of the semiconductor element and the first end of respective predetermined conductors of a plurality of conductors constituting the wiring layer could overlap. Then, the sheet was heated and pressed using a plate tool with an ultrasonic wave being applied, and thus, the element electrodes of the semiconductor element and the conductors were electrically connected to each other.

Next, after laying the second end of each of the above-mentioned predetermined conductors on a predetermined position of the wiring layer of the wiring board, an ultrasonic tool was pressed against an area of contact between the second end of each conductor and the wiring layer, and an ultrasonic wave was applied to that area with the area being pressed, and thus, the second end of each of the above-mentioned predetermined conductors and the wiring layer of the wiring board were electrically connected to each other. In the above-described manner, a semiconductor device was obtained. Next, the semiconductor device was left to stand in a constant temperature constant humidity bath held at a temperature of 30° C. and a humidity of 60% for 192 hours, and then, a reflow test was performed using a peak temperature of 260° C. After the reflow test, no defect was observed in the junctions between the element electrodes and the conductors of the sheet and the junctions between the wiring layer of the wiring board and the conductors of the sheet. Moreover, after the reflow test, the semiconductor device was left to stand in an atmosphere at −65° C. for 30 minutes and subsequently in an atmosphere at 150° C. for 30 minutes. This cycle of operation was repeated 1000 times, and then, connection resistance was measured. The variation of connection resistance was within 10%, so that it could be confirmed that a good electric connection was maintained.

EXAMPLE 2

As the wiring board, a four-layer glass epoxy board (E-679F, manufactured by Hitachi Chemical Company, Ltd.) having a thickness of 0.4 mm and provided with a recessed portion having a depth of about 0.13 mm was prepared. The wiring layer of this wiring board is constituted by a copper layer having a thickness of 18 μm and an electroless nickel plating layer and an electroless gold plating layer that are formed on the copper layer.

Next, a semiconductor element having an outside dimension of 4 mm square and a thickness of 0.1 mm was prepared. Bumps were formed on element electrodes of this semiconductor element using a gold wire having a size of 25 μm.

On the other hand, a laminated film (manufactured by Nippon Steel Chemical Co., Ltd.) constituted by a liquid crystal polymer film having a thickness of 50 μm and a copper foil bonded to the liquid crystal polymer film and having a thickness of 12 μm was prepared, and the copper foil was subjected to patterning so that it had a predetermined shape. Then, the copper foil that was subjected to patterning was plated with nickel and with gold, and thus a sheet was formed in which a wiring layer was formed on one principal face of the liquid crystal polymer film.

Next, the sheet was disposed on the semiconductor element such that each element electrode of the semiconductor element and the first end of respective predetermined conductors of a plurality of conductors constituting the wiring layer could overlap. Then, the sheet was heated and pressed using a plate tool with an ultrasonic wave being applied, and thus, the element electrodes of the semiconductor element and the conductors were electrically connected to each other.

Next, a conductive adhesive (manufactured by NAMICS CORPORATION) was printed at a predetermined position on the wiring layer of the wiring board. Then, the semiconductor element was accommodated in the recessed portion of the wiring board, and the second end of each of the predetermined conductors of the sheet was laid on the predetermined position of the wiring layer of the wiring board. Subsequently, an area of contact between the above-mentioned second end of each of the predetermined conductors and the wiring layer was heated while being pressed to cure the conductive adhesive, and thus, the above-mentioned the second end of each of the predetermined conductors and the wiring layer of the wiring board were electrically connected to each other. In the above-described manner, a semiconductor device was obtained.

Next, the semiconductor device was left to stand in a constant temperature constant humidity bath held at a temperature of 30° C. and a humidity of 60% for 192 hours, and then, a reflow test was performed using a peak temperature of 260° C. After the reflow test, no defect was observed in the junctions between the element electrodes and the conductors of the sheet and the junctions between the wiring layer of the wiring board and the conductors of the sheet. Moreover, after the reflow test, the semiconductor device was left to stand in an atmosphere at −65° C. for 30 minutes and subsequently in an atmosphere at 150° C. for 30 minutes. This cycle of operation was repeated 1000 times, and then, connection resistance was measured. The variation of connection resistance was within 10%, so that it could be confirmed that a good electric connection was maintained.

According to the present invention, it is possible to provide a semiconductor device for which the disadvantages of the semiconductor devices for which the WB method, the FC method, or the TAB method is employed has been reduced. For example, a semiconductor device having good productivity can be provided.

The specific embodiments or examples disclosed in the foregoing description are in all respects for the purpose of describing the technical details of the invention, and the invention is not to be narrowly construed as being limited to such specific examples. Various changes can be made to the invention within the spirit of the invention and the scope of the appended claims.

What is claimed is:

1. A semiconductor device comprising:
   a first semiconductor element comprising a first element body portion having a first face and a second face opposite to the first face, and a first element electrode that is formed on the first face;
   a wiring board comprising an insulating substrate and a first wiring layer that is formed on one principal face of the insulating substrate, the wiring board being disposed such that said one principal face is opposed to the second face of the first element body portion;
   a first film that covers at least a portion of a face of the first semiconductor element that comprises the surface of the first element electrode and at least a portion of a face on the first semiconductor element side of the wiring board; and
   a second wiring layer that is formed on a face on the wiring board side of the first film and that comprises a first conductor having first and second ends,
   wherein the first end of the first conductor is bonded to the first element electrode and the second end of the first conductor is bonded to a portion of the first wiring layer.

2. The semiconductor device according to claim 1, wherein the first film is substantially transparent.

3. The semiconductor device according to claim 1, wherein the first semiconductor element and the insulating substrate are bonded to each other via a bonding material.

4. The semiconductor device according to claim 1, further comprising an electromagnetic shielding layer that is formed on a face of the first film that is opposite to the face on the wiring board side of the first film.

5. The semiconductor device according to claim 1, wherein a portion of a face on the second wiring layer side of a laminated product constituted by the first film and the second wiring layer is adhered directly or indirectly to the face of the first semiconductor element that comprises the surface of the first element electrode.

6. The semiconductor device according to claim 5, wherein another portion of the face on the second wiring layer side of the laminated product that is different from said portion is adhered directly or indirectly to a lateral face of the first element body portion.

7. The semiconductor device according to claim 1, wherein a face on the wiring board side of a laminated product constituted by the first film and the second wiring layer is bonded directly or indirectly to the first semiconductor element and the wiring board, and the first semiconductor element is disposed within a closed space that is surrounded by the laminated product and the wiring board.

8. The semiconductor device according to claim 1, wherein said first end of the first conductor is in contact with the first element electrode, and said second end of the first conductor is in contact with the portion of the first wiring layer.

9. The semiconductor device according to claim 1, further comprising a third wiring layer that is formed on a face of the first film that is opposite to the face on the wiring board side of the first film.

10. The semiconductor device according to claim 9, further comprising a second semiconductor element having a second element electrode,
    wherein the second element electrode is bonded to the third wiring layer.

11. The semiconductor device according to claim 1, wherein a face of the first film that is opposite to the face on the wiring board side of the first film comprises a flat surface having an area that is equal to or larger than the area of the first face of the first element body portion.

12. The semiconductor device according to claim 11, further comprising a second semiconductor element having a second element body portion and a second element electrode that is provided on the second element body portion,
    wherein the second semiconductor element is disposed on the first film such that a face of the second element body portion that is opposite to a face of the second element body portion that comprises the surface of the second element electrode is opposed to the flat surface of the first film.

13. The semiconductor device according to claim 12, further comprising:
    a second film that covers at least a portion of the face of the second semiconductor element that comprises the surface of the second element electrode and at least a portion of a face on the second semiconductor element side of the wiring board; and
    a fourth wiring layer that is formed on a face on the wiring board side of the second film and that comprises a second conductor having first and second ends,
    wherein the first end of the second conductor is bonded to the second element electrode, and
    wherein the second end of the second conductor is bonded to another portion of the first wiring layer that is different from said portion of the first wiring layer to which said second end of the first conductor is bonded.

14. The semiconductor device according to claim 1, wherein a recessed portion is formed on the side of a face of the insulating substrate on which the first wiring layer is formed, and the first semiconductor element is disposed in the recessed portion.

15. The semiconductor device according to claim 14, wherein the face of the insulating substrate on which the first wiring layer is formed is substantially on the same plane with the first face of the first element body portion.

16. The semiconductor device according to claim 14, wherein a face of the first film that is opposite to the face on the wiring board side of the first film is substantially flat.

17. The semiconductor device according to claim 16, further comprising a second semiconductor element having a second element body portion and a second element electrode that is provided on the second element body portion,
wherein the second semiconductor element is disposed on the first film such that a face of the second semiconductor element that is opposite to a face of the second semiconductor element that comprises the surface of the second element electrode is opposed to the flat surface of the first film.

18. The semiconductor device according to claim 17, further comprising:
a second film that covers at least a portion of the face of the second semiconductor element that comprises the surface of the second element electrode and at least a portion of a face on the second semiconductor element side of the wiring board; and
a fourth wiring layer that is formed on a face on the wiring board side of the second film and that comprises a second conductor having first and second ends,
wherein the first end of the second conductor is bonded to the second element electrode, and
wherein the second end of the second conductor is bonded to another portion of the first wiring layer that is different from said portion of the first wiring layer to which said second end of the first conductor is bonded.

19. The semiconductor device according to claim 1, wherein the wiring board is a printed board or a glass board.

20. A method for manufacturing a semiconductor device, comprising a mounting step in which:
a first semiconductor element having a first element body portion and a first element electrode that is provided on the first element body portion is laid on a wiring board comprising an insulating substrate and a first wiring layer that is formed on one principal face of the insulating substrate such that a face of the first element body portion that is opposite to a face of the first element body portion on which the first element electrode is provided is opposed to said one principal face of the insulating substrate;
in a sheet comprising a film and a second wiring layer that is formed on one principal face of the film and that comprises a first conductor having first and second ends, the first end of the first conductor is bonded to the first element electrode and the second end of the first conductor is bonded to a portion of the first wiring layer; and
at least a portion of a face of the first semiconductor element that comprises the surface of the first element electrode and at least a portion of a face on the first semiconductor element side of the wiring board are covered with the film.

21. The method for manufacturing a semiconductor device according to claim 20, wherein in the mounting step, the first semiconductor element and the wiring board are bonded to each other.

22. The method for manufacturing a semiconductor device according to claim 21, wherein in the mounting step, bonding of said first end of the first conductor to the first element electrode and bonding of said second end of the first conductor to the portion of the first wiring layer are performed after the first semiconductor element and the wiring board are bonded to each other.

23. The method for manufacturing a semiconductor device according to claim 21, wherein in the mounting step, the first semiconductor element and the wiring board are bonded to each other after said first end of the first conductor is bonded to the first element electrode.

24. The method for manufacturing a semiconductor device according to claim 20, wherein in the mounting step, an ultrasonic vibration is used to bond said first end of the first conductor to the first element electrode and to bond said second end of the first conductor to the portion of the first wiring layer.

25. The method for manufacturing a semiconductor device according to claim 20, wherein in the mounting step, a portion of a face on the second wiring layer side of the sheet is adhered directly or indirectly to the face of the first semiconductor element that comprises the surface of the first element electrode.

26. The method for manufacturing a semiconductor device according to claim 25,
wherein the film contains a resin, and
wherein in the mounting step, the sheet is adhered to the face of the first semiconductor element that comprises the surface of the first element electrode by causing the film to thermally contract by heating.

27. The method for manufacturing a semiconductor device according to claim 20, wherein in the mounting step, a face of the film that is opposite to a face on the second wiring layer side of the film is made flat by heating and pressing the film.

28. The method for manufacturing a semiconductor device according to claim 20,
wherein the film contains a thermosetting resin that has not been cured, and
wherein in the mounting step, after the sheet is processed into a predetermined shape, the sheet is processed into a shape with which the sheet can cover at least a portion of the face of the first semiconductor element that comprises the surface of the first element electrode and at least a portion of the face on the first semiconductor element side of the wiring board by curing the thermosetting resin by heating, and then, said first end of the first conductor is bonded to the first element electrode and said second end of the first conductor is bonded to the portion of the first wiring layer.

29. The method for manufacturing a semiconductor device according to claim 20,
wherein a recessed portion is formed on the side of a face of the insulating substrate on which the first wiring layer is formed, and
wherein in the mounting step, the first semiconductor element is disposed in the recessed portion.

30. The method for manufacturing a semiconductor device according to claim 27, further comprising, after the mounting step, a step of disposing a second semiconductor element having a second element electrode, on a face of the film that is opposite to a face of the film on which the second wiring layer is formed,
wherein in the step, the second semiconductor element is disposed on the film such that a face of the second semiconductor element that is opposite to a face of the second semiconductor element that comprises the surface of the second element electrode is opposed to the flat surface of the film.

* * * * *